US010312254B2

(12) United States Patent
Yoshitomi et al.

(10) Patent No.: US 10,312,254 B2
(45) Date of Patent: Jun. 4, 2019

(54) SEMICONDUCTOR DEVICE AND A MANUFACTURING METHOD THEREOF

(71) Applicant: RENESAS ELECTRONICS CORPORATION, Tokyo (JP)

(72) Inventors: Atsushi Yoshitomi, Tokyo (JP); Yoshiyuki Kawashima, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 5 days.

(21) Appl. No.: 15/699,756

(22) Filed: Sep. 8, 2017

(65) Prior Publication Data

US 2018/0076206 A1    Mar. 15, 2018

(30) Foreign Application Priority Data

Sep. 12, 2016    (JP) .................... 2016-177625

(51) Int. Cl.

| | |
|---|---|
| *H01L 27/1157* | (2017.01) |
| *H01L 21/28* | (2006.01) |
| *H01L 29/66* | (2006.01) |
| *H01L 29/78* | (2006.01) |
| *H01L 29/423* | (2006.01) |
| *H01L 29/792* | (2006.01) |
| *H01L 29/40* | (2006.01) |
| *H01L 29/49* | (2006.01) |

(52) U.S. Cl.
CPC .... *H01L 27/1157* (2013.01); *H01L 21/28282* (2013.01); *H01L 29/42344* (2013.01); *H01L 29/66833* (2013.01); *H01L 29/78* (2013.01); *H01L 29/792* (2013.01); *H01L 29/408* (2013.01); *H01L 29/4983* (2013.01)

(58) Field of Classification Search
CPC ................................... H01L 27/1157
See application file for complete search history.

(56) References Cited

U.S. PATENT DOCUMENTS

| | | | |
|---|---|---|---|
| 9,391,178 B2 | 7/2016 | Fukumura | |
| 2009/0090962 A1* | 4/2009 | Kikuchi | ............ H01L 27/11568 257/324 |

FOREIGN PATENT DOCUMENTS

JP    2013-197359 A    9/2013

* cited by examiner

*Primary Examiner* — William A Harriston
(74) *Attorney, Agent, or Firm* — McDermott Will & Emery LLP

(57) ABSTRACT

The reliability and performances of a semiconductor device having a nonvolatile memory are improved. A control gate electrode is formed over a semiconductor substrate via a first insulation film. A memory gate electrode is formed over the semiconductor substrate via a second insulation film having a charge accumulation part. The second insulation film is formed across between the semiconductor substrate and the memory gate electrode, and between the control gate electrode and the memory gate electrode. Between the control gate electrode and the memory gate electrode, a third insulation film is formed between the second insulation film and the memory gate electrode. The third insulation film is not formed under the memory gate electrode. A part of the memory gate electrode is present under the lower end face of the third insulation film.

20 Claims, 22 Drawing Sheets

FIG. 4

| | OPERATION METHOD WRITE/ERASE | WRITE OPERATION VOLTAGE (V) Vmg/Vs/Vcg/Vd/Vb | ERASE OPERATION VOLTAGE (V) Vmg/Vs/Vcg/Vd/Vb | READ OPERATION VOLTAGE (V) Vmg/Vs/Vcg/Vd/Vb |
|---|---|---|---|---|
| A | SSI (WRITE)/ BTBT (ERASE) | 10/5/1/0.5/0 | -6/6/0/open/0 | 0/0/1.5/1.5/0 |
| B | SSI (WRITE)/ FN (ERASE) | 10/5/1/0.5/0 | 12/0/0/0/0 | 0/0/1.5/1.5/0 |
| C | FN (WRITE)/ BTBT (ERASE) | -12/0/0/0/0 | -6/6/0/open/0 | 0/0/1.5/1.5/0 |
| D | FN (WRITE)/ FN (ERASE) | -12/0/0/0/0 | 12/0/0/0/0 | 0/0/1.5/1.5/0 |

SEMICONDUCTOR DEVICE AND A MANUFACTURING METHOD THEREOF

CROSS-REFERENCE TO RELATED APPLICATIONS

The disclosure of Japanese Patent Application No. 2016-177625 filed on Sep. 12, 2016 including the specification, drawings and abstract is incorporated herein by reference in its entirety.

BACKGROUND

The present invention relates to a semiconductor device, and a manufacturing method thereof. More particularly, the present invention is preferably applicable to a semiconductor device having a nonvolatile memory, and a manufacturing method thereof.

As electrically writable/erasable nonvolatile semiconductor storage devices, EEPROMs (Electrically Erasable and Programmable Read Only Memories) have been widely used. The storage devices typified by currently and widely used flash memories have conductive floating gate electrodes surrounded by an oxide film, or trapping insulation films under gate electrodes of MISFETs. The storage devices use charge accumulation states at the floating gates or the trapping insulation film as stored information, and read out the information as a threshold value of each transistor. The trapping insulation film denotes an insulation film capable of accumulating electric charges. As one example thereof, mention may be made of a silicon nitride film. Implantation/discharge of electric charges into such charge accumulation regions causes each MISFET to be shifted in threshold value and to operate as a storage element. The flash memories include a split gate type cell using a MONOS (Metal Oxide Nitride Oxide Semiconductor) film. Such a memory has the following advantages: use of a silicon nitride film as a charge accumulation region leads to an excellent data holding reliability because electric charges are accumulated discretely as compared with a conductive floating gate, and the excellent data holding reliability can reduce the film thickness of the oxide films over and under the silicon nitride film, which enables a lower voltage for write/erase operation; and other advantages.

Japanese Unexamined Patent Application Publication No. 2013-197359 (Patent Document 1) describes the technology regarding a split gate type memory.

[Patent Document 1] Japanese Unexamined Patent Application Publication No. 2013-197359

SUMMARY

A semiconductor device having a nonvolatile memory is expected to be improved in reliability. Alternatively, the semiconductor device is expected to be improved in performances. Still alternatively, the semiconductor device is expected to be improved in reliability, and to be improved in performances.

Other objects and novel features will be apparent from the description of this specification and the accompanying drawings.

In accordance with one embodiment, a semiconductor device has a first gate electrode for a memory cell of a nonvolatile memory formed over a semiconductor substrate via a first gate insulation film, and a second gate electrode for the memory cell formed over the semiconductor substrate via a second gate insulation film having a charge accumulation part. The second gate insulation film is formed across between the semiconductor substrate and the second gate electrode, and between the first gate electrode and the second gate electrode. The semiconductor device further has a first insulation film formed between the second gate insulation film and the second gate electrode, in between the first gate electrode and the second gate electrode. The first insulation film is not formed under the second gate electrode. A part of the second gate electrode is present under the lower end face of the first insulation film.

In accordance with one embodiment, a semiconductor device can be improved in reliability.

Alternatively, a semiconductor device can be improved in performances.

Still alternatively, a semiconductor device can be improved in reliability, and can be improved in performances.

BRIEF DESCRIPTION OF THE DRAWINGS

FIG. 4 is a table showing one example of the application conditions of voltages to respective sites of a selection memory cell at the times of "write", "erase", and "read";

DETAILED DESCRIPTION

Figure 1:
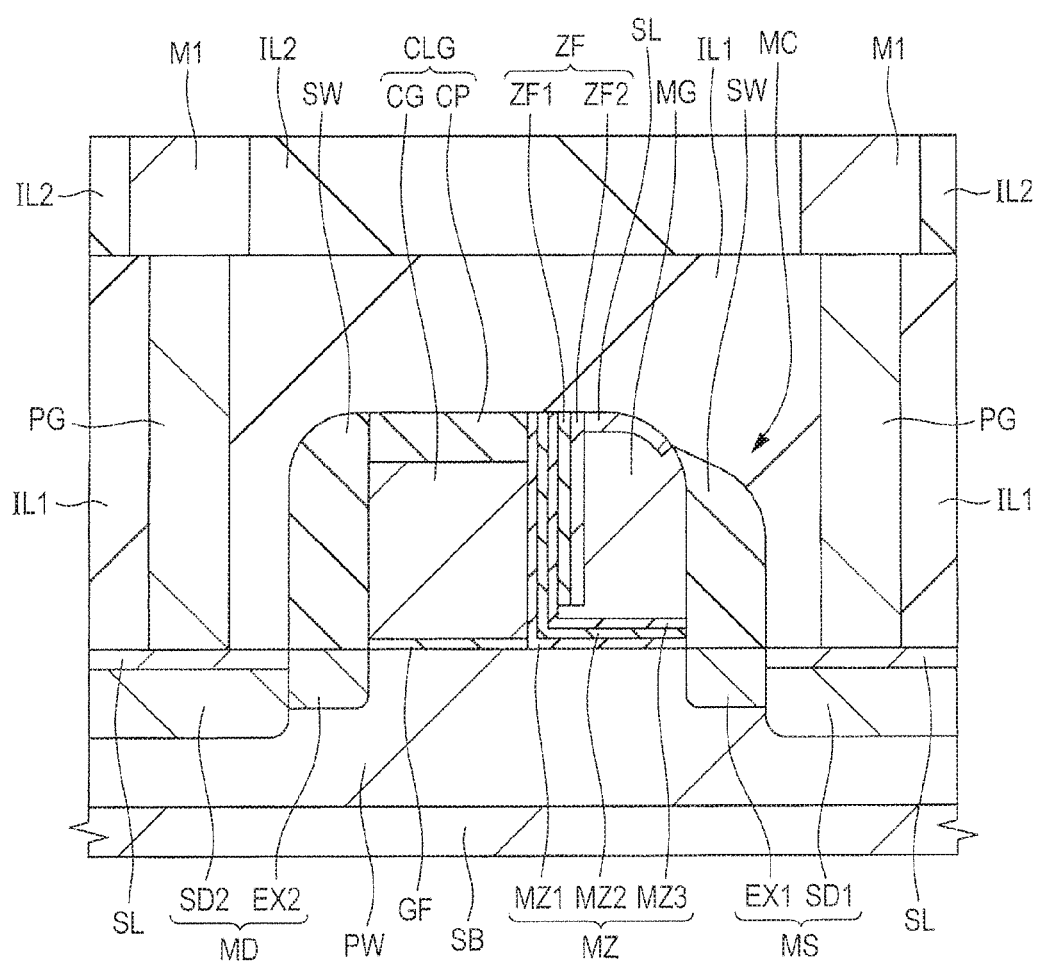
FIG. 1 is an essential part cross sectional view of a semiconductor device of one embodiment of the present invention.

In description of the following embodiment, the embodiment may be described in a plurality of divided sections or embodiments for convenience, if required. However, unless otherwise specified, these are not independent of each other, but are in a relation such that one is a modified example, details, a complementary explanation, or the like of a part or the whole of the other. Further, in the following embodiments, when a reference is made to the number of elements, and the like (including number, numerical value, quantity, range, or the like), the number of elements, or the like is not limited to the specific number, but may be greater than or less than the specific number, unless otherwise specified, except for the case where the number is apparently limited to the specific number in principle, or except for other cases. Further, in the following embodiments, it is needless to say that the constitutional elements (including element steps, or the like) are not always essential, unless otherwise specified, and except for the case where they are apparently considered essential in principle, or except for other cases. Similarly, in the following embodiments, when a reference is made to the shapes, positional relationships, or the like of the constitutional elements, or the like, it is understood that they include ones substantially analogous or similar to the shapes or the like, unless otherwise specified, and unless otherwise considered apparently in principle, or except for other cases. This also applies to the foregoing numerical values and ranges.

Below, the embodiments will be described in details by reference to the accompanying drawings. Incidentally, in all the drawings for describing the embodiments, the members having the same function are given the same reference signs and numerals, and a repeated description thereon is omitted. Further, in the following embodiments, a description on the same or similar part will not be repeated in principle unless otherwise required.

Further, in drawings for use in the embodiments, hatching may be omitted even in cross section for ease of understanding of the drawing. Whereas, hatching may be added even in plan view for ease of understanding of the drawing.

Embodiment

<Regarding a Structure of a Semiconductor Device>

Each semiconductor device of the present embodiment and the following embodiments is a semiconductor device including a nonvolatile memory (nonvolatile storage element, flash memory, or nonvolatile semiconductor storage device), and the nonvolatile memory uses a trapping insulation film (an insulation film capable of accumulating electric charges) mainly at the electric charge accumulation part. In the present embodiment and the following embodiments, a nonvolatile memory will be described with reference to a memory cell based on an n channel type MISFET (MISFET: Metal Insulator Semiconductor Field Effect Transistor). Further, the polarities in the present embodiment and the following embodiments are for describing the operation in the case of a memory cell based on an n channel type MISFET. When a memory cell is based on a p channel type MISFET, by inverting all the polarities of applied potentials, the conductivity type of carriers, and the like, it is possible to obtain the same operation in principle.

Figure 2:
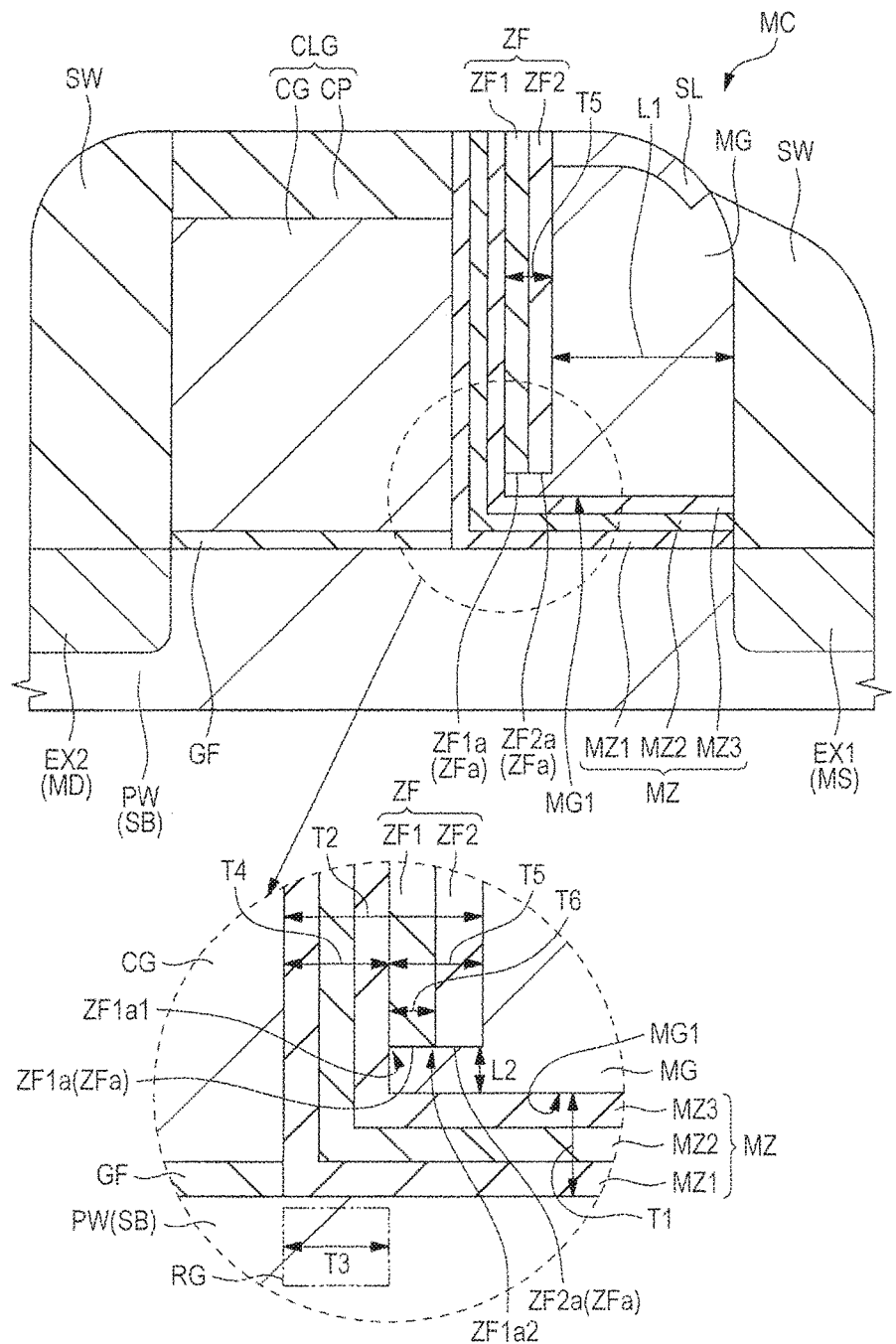
FIG. 2 is a partially enlarged cross sectional view of a part of FIG. 1 on an enlarged scale.

The semiconductor device of the present embodiment will be described by reference to the accompanying drawings. FIG. 1 is an essential part cross sectional view of the semiconductor device of the present embodiment. FIG. 1 shows an essential part cross sectional view of the memory cell region of the nonvolatile memory. FIG. 2 is a partially enlarged cross sectional view (essential part cross sectional view) of a memory cell MC in the semiconductor device of the present embodiment, and shows a part of FIG. 1 on an enlarged scale. Incidentally, in FIG. 2, for ease of understanding of the drawing, an interlayer insulation film IL1 shown in FIG. 1 is not shown. The enlarged view of the region surrounded by a dotted line of FIG. 2 is extracted and shown on the bottom side of FIG. 2.

The semiconductor device of the present embodiment shown in FIGS. 1 and 2 is a semiconductor device having a nonvolatile memory.

In a semiconductor substrate (semiconductor wafer) SB formed of, for example, a p type single crystal silicon having a specific resistance of about 1 to 10 Ωcm, a MISFET forming the memory cell MC of the nonvolatile memory is formed.

In the semiconductor substrate SB, an element isolation region (not shown) for isolating elements is formed. In an active region defined by the element isolation regions, a p type well PW is formed. In the p type well PW in the memory cell region, the memory cell MC of a nonvolatile memory formed of a memory transistor and a control transistor as shown in FIG. 1 is formed. In the semiconductor substrate SB, in actuality, a plurality of memory cells MC are formed in an array. FIG. 1 shows the cross section of one memory cell MC of these. Each memory cell region is electrically isolated from other regions by the element isolation regions.

As shown in FIGS. 1 and 2, the memory cell MC of the nonvolatile memory in the semiconductor device of the present embodiment is a split gate type memory cell, and includes two MISFETs of a control transistor having a control gate electrode CG and a memory transistor having a memory gate electrode MG, coupled to each other.

Herein, the MISFET (Metal Insulator Semiconductor Field Effect Transistor) having a gate insulation film including a charge accumulation part (charge accumulation layer), and the memory gate electrode MG is referred to as a memory transistor. Whereas, the MISFET having a gate insulation film and the control gate electrode CG is referred to as a control transistor. Therefore, the memory gate electrode MG is the gate electrode of the memory transistor. The control gate electrode CG is the gate electrode of the control transistor. The control gate electrode CG and the memory gate electrode MG are the gate electrodes forming (the memory cell of) the nonvolatile memory.

Incidentally, the control transistor is a transistor for memory cell selection, and hence can also be regarded as a selection transistor. Accordingly, the control gate electrode CG can also be regarded as a selection gate electrode. The memory transistor is a transistor for storage.

Below, the configuration of the memory cell MC will be described specifically.

As shown in FIGS. 1 and 2, the memory cell MC of the nonvolatile memory has an n type semiconductor region MS or MD for source or drain formed in the p type well PW of the semiconductor substrate SB, a control gate electrode CG formed over the semiconductor substrate SB (p type well PW), and a memory gate electrode MG formed over the semiconductor substrate SB (p type well PW), and adjacent to the control gate electrode CG. The memory cell MC of the nonvolatile memory further has an insulation film (gate insulation film) GF formed between the control gate electrode CG and the semiconductor substrate SB (p type well PW), and an insulation film MZ formed between the memory gate electrode MG and the semiconductor substrate SB (p type well PW) and between the memory gate electrode MG and the control gate electrode CG. The memory cell MC of the nonvolatile memory further has an insulation film ZF formed between the insulation film MZ and the memory gate electrode MG, in between the control gate electrode CG and the memory gate electrode MG. The memory cell MC of the nonvolatile memory further has sidewall spacers SW formed over the side surfaces of the memory gate electrode MG and the control gate electrode CG on the sides thereof not adjacent to each other. The memory gate electrode MG of each memory cell MC forms the word line of each memory cell MC.

Over the control gate electrode CG, a cap insulation film CP is formed. The lamination body formed of the control gate electrode CG and the cap insulation film CP over the control gate electrode CG will be hereinafter referred to as a control gate CLG. As another form, the cap insulation film CP may not be formed over the control gate electrode CG. Below, a description will be given to the case where the cap insulation film CP is formed over the control gate electrode CG. However, when the cap insulation film CP is not formed, the whole control gate CLG serves as the control gate electrode CG. Therefore, when the cap insulation film CP is not formed, in the following description, the "control gate CLG" can be read as the "control gate electrode CG".

The control gate CLG and the memory gate electrode MG extend and are arranged side by side along the main surface of the semiconductor substrate SB with the insulation film ZF and the insulation film MZ interposed between their respective opposed side surfaces. The direction of extension of the control gate CLG and the memory gate electrode MG is the direction perpendicular to each paper plane of FIGS. 1 and 2. The control gate CLG and the memory gate electrode MG are formed over the semiconductor substrate SB (p type well PW) between the semiconductor region MD and the semiconductor region MS via the insulation film GF or the insulation film MZ. The memory gate electrode MG is situated on the semiconductor region MS side, and the control gate CLG is situated on the semiconductor region MD side. However, the control gate electrode CLG and the memory gate electrode MG are formed over the semiconductor substrate SB (p type well PW) via the insulation film GF and via the insulation film MZ, respectively.

The control gate electrode CG and the memory gate electrode MG are adjacent to each other with the insulation film ZF and the insulation film MZ interposed therebetween. The memory gate electrode MG is formed in a sidewall spacer shape over the side surface (sidewall) of the control gate CLG via the insulation film MZ and the insulation film ZF The insulation film MZ extends across both the regions of the region between the memory gate electrode MG and the semiconductor substrate SB (p type well PW), and the region between the memory gate electrode MG and the control gate CLG.

Incidentally, the insulation film MZ and the insulation film ZF are interposed between the memory gate electrode MG and the control gate CLG. Between the memory gate electrode MG and the control gate CLG, the insulation film MZ is on the control gate CLG side, and the insulation film ZF is on the memory gate electrode MG side. Namely, between the memory gate electrode MG and the control gate CLG, a lamination structure (lamination film) of the insulation film MZ and the insulation film ZF is interposed. The insulation film MZ is adjacent to the control gate CLG, and the insulation film ZF is adjacent to the memory gate electrode MG. Accordingly, the portion of the insulation film MZ situated between the memory gate electrode MG and the control gate CLG is interposed between the insulation film ZF and the control gate CLG. The insulation film ZF situated between the memory gate electrode MG and the control gate CLG is interposed between the insulation film MZ and the memory gate electrode MG.

The insulation film GF formed between the control gate CLG and the semiconductor substrate SB (p type well PW), namely, the insulation film GF under the control gate CLG functions as the gate insulation film of the control transistor.

The insulation film GF can be formed of, for example, a silicon oxide film or a silicon oxynitride film. Alternatively, for the insulation film GF, a high dielectric constant film having a higher dielectric constant than that of a silicon nitride film such as a hafnium oxide film, an aluminum oxide film (alumina), or a tantalum oxide film may be used other than the silicon oxide film, silicon oxynitride film, or the like.

Alternatively, the insulation film MZ extending in the region between the memory gate electrode MG and the semiconductor substrate SB (p type well PW), and the region between the memory gate electrode MG and the control gate CLG can be regarded as a gate insulation film (a lamination gate insulation film, or a gate insulation film of a lamination structure). However, the insulation film MZ between the memory gate electrode MG and the semiconductor substrate SB (p type well PW), namely, the insulation film MZ under the memory gate electrode MG functions as the gate insulation film of the memory transistor. Whereas, the insulation film MZ between the memory gate electrode MG and the control gate CLG functions as an insulation film for establishing an insulation (electrical isolation) between the memory gate electrode MG and the control gate CLG.

The insulation film MZ is a lamination insulation film, and is formed of a lamination film having an insulation film MZ1, an insulation film MZ2 over the insulation film MZ1, and an insulation film MZ3 over the insulation film MZ2. Herein, the insulation film MZ1 is formed of a silicon oxide film (oxide film); the insulation film MZ2 is formed of a silicon nitride film (nitride film); and the insulation film MZ3 is formed of a silicon oxide film (oxide film).

Incidentally, in FIG. 1, for ease of understanding of the drawing, the lamination film formed of the insulation film MZ1, the insulation film MZ2, and the insulation film MZ3 is shown simply as the insulation film MZ. However, in actuality, as shown in FIG. 2, the insulation film MZ is formed of the lamination film of the insulation film MZ1, the insulation film MZ2, and the insulation film MZ3.

Of the insulation film MZ, the insulation film MZ2 is an insulation film having a charge accumulation function. Namely, of the insulation film MZ, the insulation film MZ2 is an insulation film for accumulating electric charges, and can function as a charge accumulation layer (charge accumulation part). In other words, the insulation film MZ2 is a trapping insulation film. Herein, the trapping insulation film denotes an insulation film capable of accumulating electric charges. Thus, as the insulation film having a trap level, the insulation film MZ2 is used. For this reason, the insulation film MZ can be regarded as an insulation film having a charge accumulation part (herein, the insulation film MZ2).

Of the insulation film MZ, the insulation film MZ3 and the insulation film MZ1 can each function as a charge block layer for confining electric charges in the trapping insulation film. By adopting a structure in which the insulation film MZ2 of the trapping insulation film is interposed between the insulation films MZ1 and MZ3 each functioning as a charge block layer, it becomes possible to accumulate electric charges into the insulation film MZ2.

Each bandgap of the insulation film MZ3 and the insulation film MZ1 is required to be larger than the bandgap of the charge accumulation layer (herein, the insulation film MZ2) between the insulation film MZ3 and the insulation film MZ1. Namely, each bandgap of the insulation film MZ1 and the insulation film MZ3 is larger than the bandgap of the insulation film MZ2 of a trapping insulation film. With this configuration, the insulation film MZ3 and the insulation film MZ1 interposing the insulation film MZ2 as a charge accumulation layer can each function as a charge block layer. A silicon oxide film has a larger bandgap than the bandgap of a silicon nitride film. For this reason, a silicon nitride film is adopted as the insulation film MZ2, and silicon oxide films can be adopted as the insulation film MZ1 and the insulation film MZ3, respectively.

The insulation film ZF is formed of a lamination film of an insulation film ZF1 and an insulation film ZF2. Of the insulation films ZF1 and ZF2, the insulation film ZF1 is situated on the control gate CLG side, and the insulation film ZF2 is situated on the memory gate electrode MG side. Namely, the insulation film ZF2 is interposed between the insulation film ZF1 and the memory gate electrode MG, and the insulation film ZF1 is interposed between the insulation film ZF2 and the insulation film MZ (more particularly, the insulation film MZ3). Accordingly, the insulation film ZF1 is in contact with the insulation film MZ (more particularly, the insulation film MZ3), and the insulation film ZF2 is in contact with the memory gate electrode MG. Accordingly, a lamination structure (lamination film) of the insulation film MZ1, the insulation film MZ2, the insulation film MZ3, the insulation film ZF1, and the insulation film ZF2 is interposed between the control gate CLG and the memory gate electrode MG. The insulation film MZ1, the insulation film MZ2, the insulation film MZ3, the insulation film ZF1, and the insulation film ZF2 are arranged sequentially from the side closer to the control gate CLG.

The insulation film ZF1 and the insulation film ZF2 are formed of mutually different materials, respectively. Preferably, the insulation film ZF1 is formed of a silicon nitride film (nitride film), and the insulation film ZF2 is formed of a silicon oxide film (oxide film). Further, the insulation film MZ3 and the insulation film ZF1 are formed of mutually different materials, respectively.

The lower end face (lower end) ZFa of the insulation film ZF is at a higher position than that of the lower surface MG1 of the memory gate electrode MG. Accordingly, in the height direction, the lower end face ZFa of the insulation film ZF is not in contact with the insulation film MZ, and a part of the memory gate electrode MG is present under the lower end face ZFa of the insulation film ZF. Namely, in the height direction, a part of the memory gate electrode MG is interposed between the lower end face ZFa of the insulation film ZF and the insulation film MZ.

The lower end face ZFa of the insulation film ZF is formed of the lower end face (lower end) ZF1a of the insulation film ZF1 and the lower end face (lower end) ZF2a of the insulation film ZF2. Accordingly, the lower end face ZF1a of the insulation film ZF1 and the lower end face ZF2a of the insulation film ZF2 are at a higher position than that of the lower surface MG1 of the memory gate electrode MG. The lower end face ZF1a of the insulation film ZF1 and the lower end face ZF2a of the insulation film ZF2 are not in contact with the insulation film MZ. A part of the memory gate electrode MG is present under the lower end faces ZF1a and ZF2a of the insulation films ZF1 and ZF2. Namely, in the height direction, a part of the memory gate electrode MG is interposed between the lower end face ZF1a of the insulation film ZF1 and the insulation film MZ, and between the lower end face ZF2a of the insulation film ZF2 and the insulation film MZ.

Herein, the height direction (vertical direction) corresponds to the direction generally perpendicular to the main surface of the semiconductor substrate SB. Whereas, the height or the height position represents the height or the height position in the direction generally perpendicular to the main surface of the semiconductor substrate SB with reference to the main surface of the semiconductor substrate SB. Further, in the structure over the main surface of the semiconductor substrate SB, the side more distant from the main surface of the semiconductor substrate SB is defined as a higher side, and the side closer to the main surface of the semiconductor substrate SB is defined as a lower side.

Further, the insulation film ZF, namely, the insulation film ZF1 and the insulation film ZF2 are not formed between the semiconductor substrate SB and the memory gate electrode MG, but are formed between the control gate CLG and the memory gate electrode MG, and hence, extend in the vertical direction (the direction generally perpendicular to the main surface of the semiconductor substrate SB) in such a manner as to be along the side surface of the control gate CLG, or the side surface of the memory gate electrode MG. All of the lower end face ZFa of the insulation film ZF, the lower end face ZF1a of the insulation film ZF1, and the lower end face ZF2a of the insulation film ZF2 are end faces on the side opposed to the semiconductor substrate SB. Whereas, the lower surface MG1 of the memory gate electrode MG is the surface opposed to the semiconductor substrate SB via the insulation film MZ.

At a position lower than the lower end face ZFa of the insulation film ZF, the insulation film MZ is interposed but the insulation film ZF is not interposed between the control gate electrode CG and the memory gate electrode MG. On the other hand, at a position higher than the lower end face ZFa of the insulation film ZF, a lamination structure (lamination film) of the insulation film MZ and the insulation film ZF is interposed between the control gate electrode CG and the memory gate electrode MG. In other words, the insulation film ZF is not interposed, but the insulation film MZ is interposed between the control gate electrode CG and a portion of the memory gate electrode MG situated under the lower end face ZFa of the insulation film ZF. On the other hand, a lamination structure (lamination film) of the insulation film MZ and the insulation film ZF is interposed between the control gate electrode CG and a portion of the memory gate electrode MG at a higher position than that of the lower end face ZFa of the insulation film ZF.

The semiconductor region MS is a semiconductor region functioning as one of a source region or a drain region. The semiconductor region MD is a semiconductor region functioning as the other of a source region or a drain region. Herein, the semiconductor region MS is a semiconductor region functioning as a source region, and the semiconductor region MD is a semiconductor region functioning as a drain region. The semiconductor regions MS and MD are each formed of a semiconductor region doped with an n type impurity (n type impurity diffusion layer) and each have a LDD (lightly doped drain) structure. Namely, the semiconductor region MS for source has an n$^-$ type semiconductor region EX1, and an n$^+$ type semiconductor region SD1 having a higher impurity density than that of the n$^-$ type semiconductor region EX1. The semiconductor region MD for drain has an n$^-$ type semiconductor region EX2, and an n$^+$ type semiconductor region SD2 having a higher impurity density than that of the n$^-$ type semiconductor region EX2. The n$^+$ type semiconductor region SD1 is larger in junction depth and higher in impurity density than the n$^-$ type semiconductor region EX1. Whereas, the n$^+$ type semiconductor region SD2 is larger in junction depth and higher in impurity density than the n$^-$ type semiconductor region EX2.

Over respective side surfaces on the sides not adjacent to each other of the memory gate electrode MG and the control gate electrode CG, sidewall spacers (sidewalls or sidewall insulation films) SW formed of an insulation film (a silicon oxide film or a silicon nitride film, or a lamination film thereof) are formed, respectively. Namely, over the side surface of the memory gate electrode MG opposite to the side thereof adjacent to the control gate CLG via the insulation film MZ and the insulation film ZF, and over the side surface of the control gate CLG opposite to the side thereof adjacent to the memory gate electrode MG via the insulation film MZ and the insulation film ZF, sidewall spacers SW are formed, respectively.

The source-side n$^-$ type semiconductor region EX1 is formed in self-alignment with the side surface of the memory gate electrode MG. The n$^+$ type semiconductor region SD1 is formed in self-alignment with the side surface of the sidewall spacer SW over the side surface of the memory gate electrode MG (the side surface opposite to the side thereof in contact with the memory gate electrode MG). For this reason, the low-concentration n$^-$ type semiconductor region EX1 is formed under the sidewall spacer SW over the side surface of the memory gate electrode MG. The high-concentration n$^+$ type semiconductor region SD1 is formed outside the low-concentration n$^-$ type semiconductor region EX1. Therefore, the low-concentration n$^-$ type semiconductor region SD1 is formed in such a manner as to be adjacent to the channel region of the memory transistor. The high-concentration n$^+$ type semiconductor region SD1 is formed in such a manner as to be in contact with (adjacent to) the low-concentration n$^-$ type semiconductor region EX1, and to be separated from the channel region of the memory transistor by the n$^-$ type semiconductor region EX1.

The drain-side n$^-$ type semiconductor region EX2 is formed in self-alignment with the side surface of the control gate electrode CG. The n$^+$ type semiconductor region SD2 is formed in self-alignment with the side surface of the sidewall spacer SW over the side surface of the control gate CLG (the side surface opposite to the side thereof in contact with the control gate CLG). For this reason, the low-concentration n$^-$ type semiconductor region EX2 is formed under the sidewall spacer SW over the side surface of the control gate CLG. The high-concentration n$^+$ type semiconductor region SD2 is formed outside the low-concentration n$^-$ type semiconductor region EX2. Therefore, the low-concentration n$^-$ type semiconductor region EX2 is formed in such a manner as to be adjacent to the channel region of the control transistor. The high-concentration n$^+$ type semiconductor region SD2 is formed in such a manner as to be in contact with (adjacent to) the low-concentration n$^-$ type semiconductor region EX2, and to be separated from the channel region of the control transistor by the n$^-$ type semiconductor region EX2.

In the p type well PW, the channel region of the memory transistor is formed under the insulation film MZ under the memory gate electrode MG; and the channel region of the selection transistor is formed under the insulation film GF under the control gate CLG. In the channel formation region of the selection transistor, a semiconductor region (a p type semiconductor region or an n type semiconductor region) for adjusting the threshold value of the selection transistor is formed, if required. Whereas, in the channel formation region of the memory transistor, a semiconductor region (a p type semiconductor region or an n type semiconductor region) for adjusting the threshold value of the memory transistor is formed, if required.

In the present embodiment, the control gate CLG has a lamination structure of the control gate electrode CG formed of a conductor (conductive film), and the cap insulation film CP formed over the control gate electrode CG. The cap insulation film CP is formed of, for example, a silicon nitride film. As the cap insulation film CP, a lamination film of a silicon oxide film, and a silicon nitride film formed over the silicon oxide film, and thicker than the silicon oxide film may also be used.

The control gate electrode CG is formed of a conductive film, and is formed of a silicon film such as an n type polysilicon film. Specifically, the control gate electrode CG is formed of a patterned silicon film. Of the control gate CLG, the control gate electrode CG functions as a gate electrode. The cap insulation film CP is formed of an insulator (insulation film), and hence does not function as a gate electrode. The gate length of the control gate electrode CG can be set at, for example, about 80 to 120 nm.

Incidentally, in the present embodiment, the control gate CLG has a lamination structure of the control gate electrode CG, and the cap insulation film CP over the control gate electrode CG. However, as another form, the cap insulation film CP may not be formed. In that case, the control gate CLG is formed of the control gate electrode CG, and does not have the cap insulation film CP.

The memory gate electrode MG is formed of a conductive film, and is formed of a silicon film such as an n type polysilicon film. Specifically, the memory gate electrode MG is formed in the following manner: the silicon film formed over the semiconductor substrate SB in such a manner as to cover the control gate CLG is anisotropically etched (etched back), so that the silicon film is selectively left over the side surface of the control gate CLG via the insulation film MZ and the insulation film ZF. For this reason, the memory gate electrode MG is formed in a sidewall spacer shape over one side surface of the control gate CLG via the insulation film MZ and the insulation film ZF. The gate length of the memory gate electrode MG can be set at, for example, about 30 to 100 nm. The cap insulation film CP is formed over the control gate electrode CG. At the side surface of the control gate CLG of the lamination body, the memory gate electrode MG is formed. Accordingly, the height position of the uppermost part of the memory gate electrode MG can be set higher than the top surface of the control gate electrode CG.

At the top (top surface) of (the silicon film PS2 forming) the memory gate electrode MG, and respective tops (top surfaces or front surfaces) of the $n^+$ type semiconductor regions SD1 and SD2, metal silicide layers SL are formed by a Salicide: Self Aligned Silicide technology, or the like. The metal silicide layer SL is formed of, for example, a cobalt silicide layer, a nickel silicide layer, or a platinum-doped nickel silicide layer. The metal silicide layer SL can reduce the diffusion resistance or the contact resistance.

When the metal silicide layer SL is formed at the top of the memory gate electrode MG, the combination of the silicon film forming the memory gate electrode MG, and the metal silicide layer SL thereover can also be regarded as the memory gate electrode MG. Whereas, when the cap insulation film CP is not formed, the cap insulation film CP is not formed over the control gate electrode CG. Accordingly, the metal silicide layer SL may be formed at the top of the control gate electrode CG.

Over the semiconductor substrate SB, an interlayer insulation film IL1 is formed as an insulation film in such a manner as to cover the control gate CLG, the memory gate electrode MG, and the sidewall spacers SW. The interlayer insulation film IL1 is formed of a single film of a silicon oxide film, a lamination film of a silicon nitride film and a silicon oxide film formed over the silicon nitride film, and thicker than the silicon nitride film, or the like. The top surface of the interlayer insulation film IL1 is planarized.

In the interlayer insulation film IL1, a plurality of contact holes (through holes) are formed. In each contact hole, a conductive plug (contact plug) PG is formed (embedded).

The plugs PG are formed over the $n^+$ type semiconductor regions SD1 and SD2, the control gate electrode CG, the memory gate electrode MG, and the like.

Over the interlayer insulation film IL1 including the plugs PG embedded therein, a wire M1 is formed. The wire M1 is, for example, a damascene wire (embedded wire), and is embedded in the wire trench provided in an insulation film IL2 formed over the interlayer insulation film IL1. The wire M1 is electrically coupled with the source region (semiconductor region MS) of the memory transistor, the drain region (semiconductor region MD) of the control transistor, the control gate electrode CG, the memory gate electrode MG, or the like via the plug PG. Incidentally, FIG. 1 shows, as an example of the wire M1, the wire M1 electrically coupled with the drain region (semiconductor region MD) of the control transistor via the plug PG.

Wires and insulation films further higher than the wire M1 are also formed, but herein are not shown and not described. Alternatively, the wire M1 and wires at higher layers than that are not limited to damascene wires (embedded wires), and can also be formed by patterning a conductor film for each wire. For example, a tungsten wire or an aluminum wire may also be adopted.

<Regarding Operation of Nonvolatile Memory>

Then, the operation example of the nonvolatile memory will be described by reference to FIGS. 3 to 8.

Figure 3:
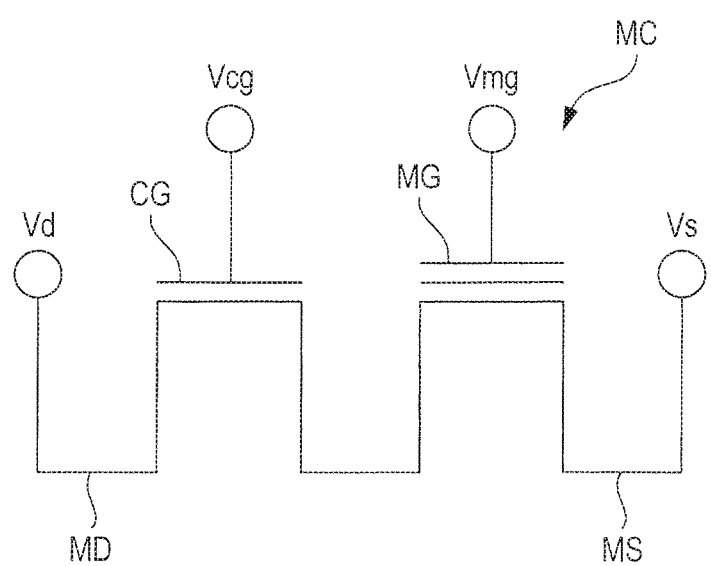
FIG. 3 is an equivalent circuit diagram of a memory cell.
Figure 5:
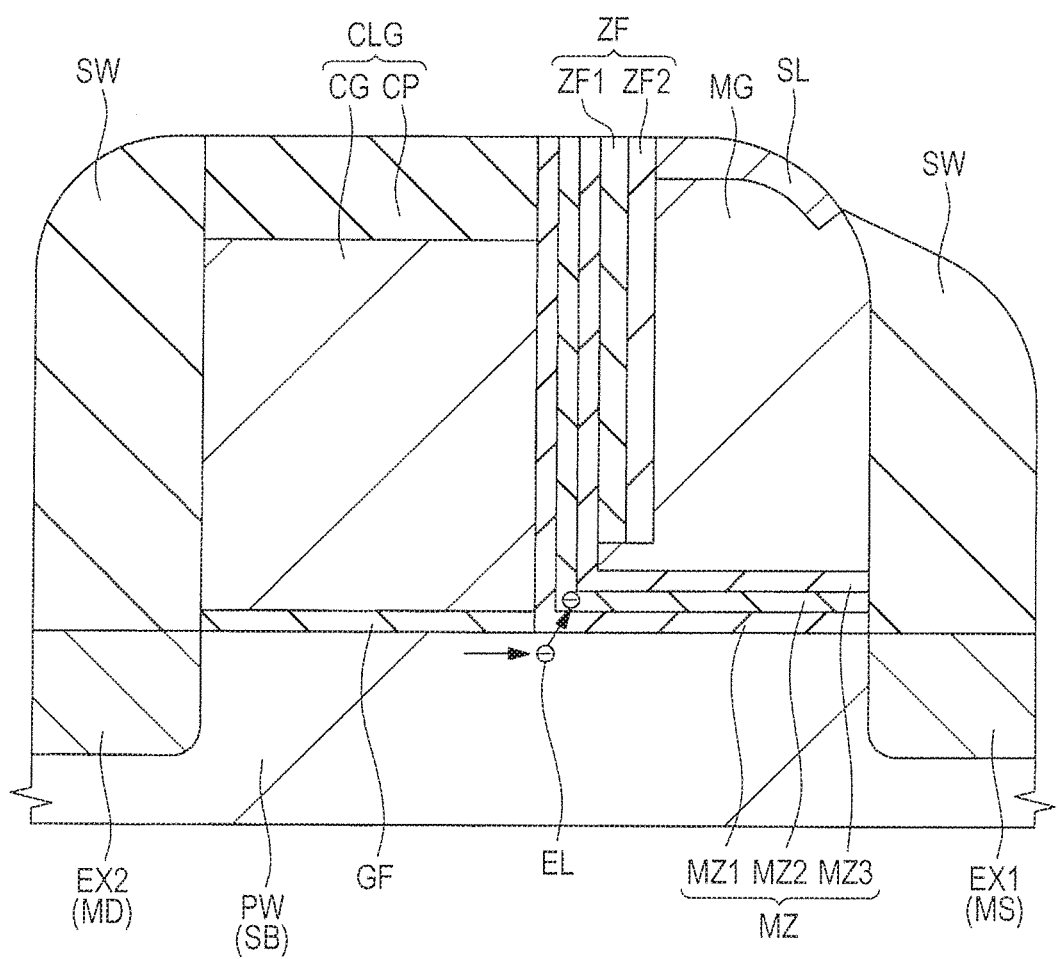
FIG. 5 is a cross sectional view for illustrating write of a SSI method.
Figure 6:
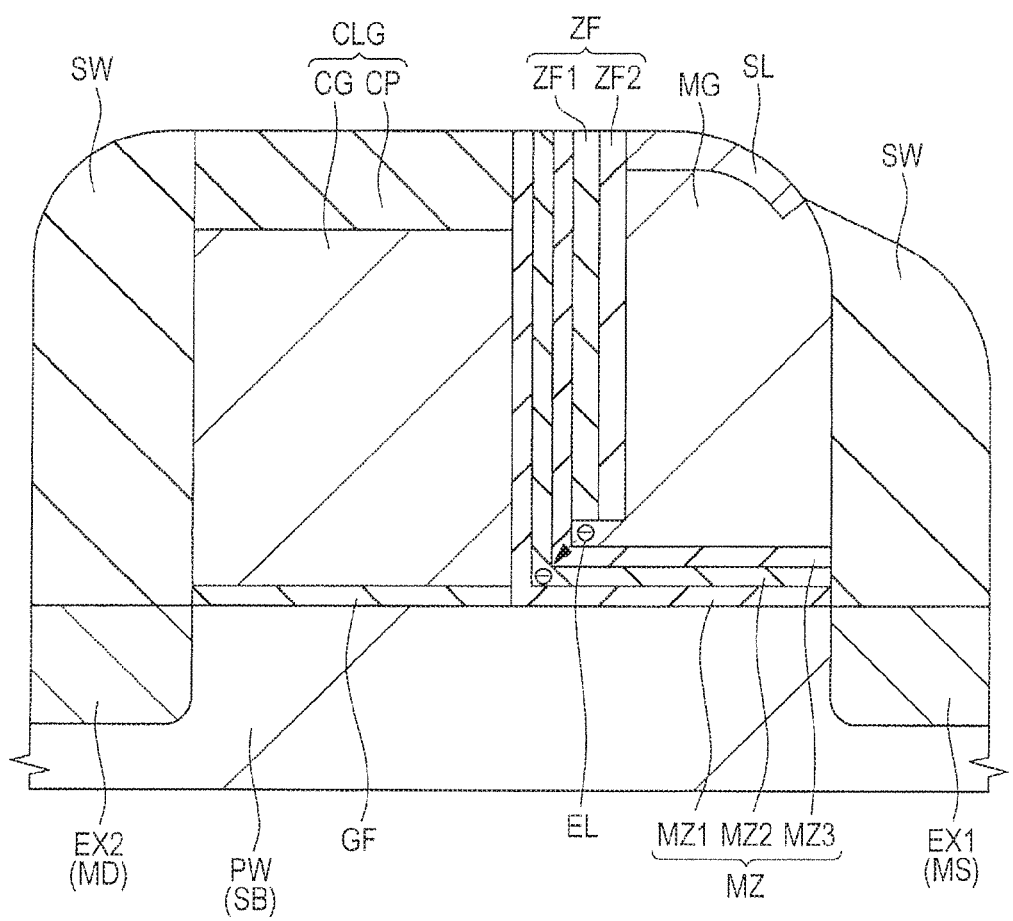
FIG. 6 is a cross sectional view for illustrating write of a FN method.
Figure 7:
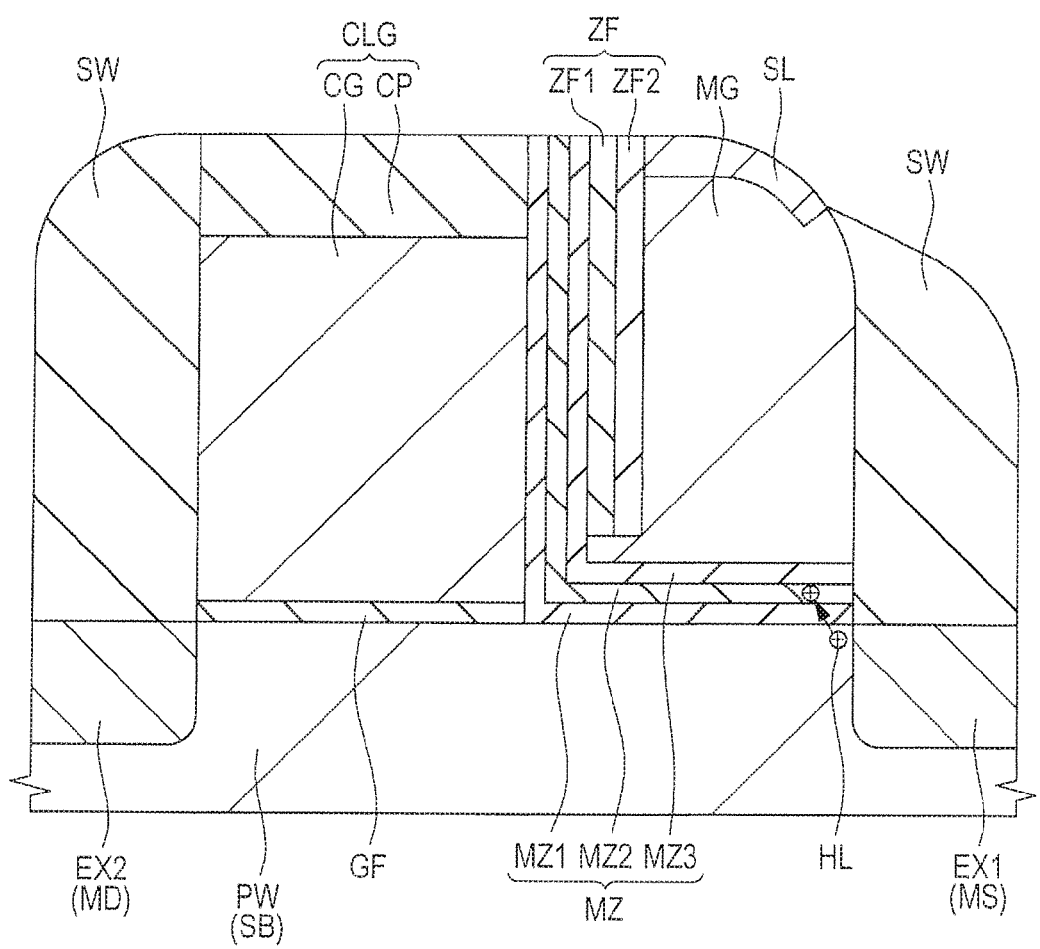
FIG. 7 is a cross sectional view for illustrating erase of a BTBT method.
Figure 8:
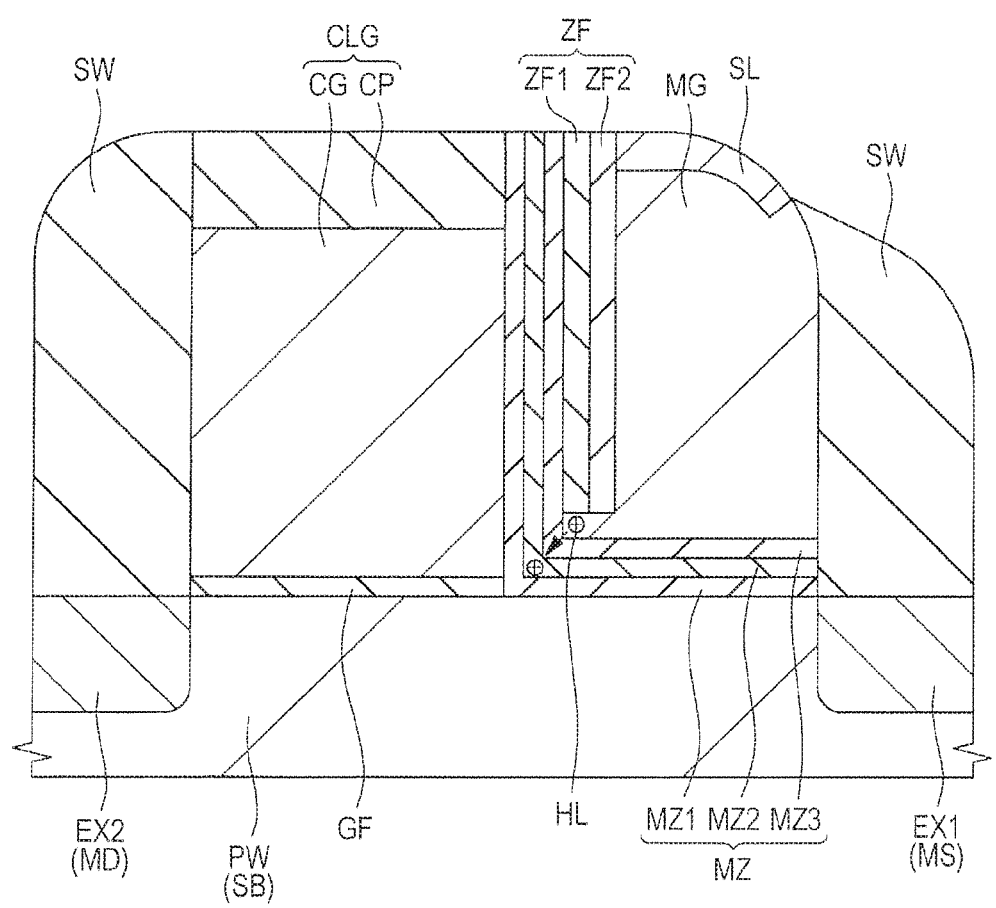
FIG. 8 is a cross sectional view for illustrating erase of a FN method.

FIG. 3 is an equivalent circuit diagram of the memory cell MC. FIG. 4 is a table showing one example of the application conditions of voltages to respective sites of a selection memory cell at the times of "write", "erase", and "read of the present embodiment. FIG. 5 is a cross sectional view for illustrating write of a SSI method. FIG. 6 is a cross sectional view for illustrating write of a FN method. FIG. 7 is a cross sectional view for illustrating erase of a BTBT method. FIG. 8 is a cross sectional view for illustrating erase of a FN method. FIGS. 5 to 8 each show a cross sectional view corresponding to the FIG. 2. FIGS. 5 and 6 each schematically show electrons EL to be implanted into the insulation film MZ2 of the insulation film MZ at the time of write. FIGS. 7 and 8 each schematically show holes HL to be implanted into the insulation film MZ2 of the insulation film MZ at the time of erase.

Herein, the voltage Vmg is the voltage to be applied to the memory gate electrode MG. The voltage Vs is the voltage to be applied to the semiconductor region MS. The voltage Vcg is the voltage to be applied to the control gate electrode CG. The voltage Vd is the voltage to be applied to the semiconductor region MD. Whereas, the base voltage Vb is the base voltage to be applied to the p type well PW. Incidentally, those shown in the table of FIG. 4 are preferable examples of the application conditions of voltages, and the present invention is not limited thereto. Further, in the present embodiment, injection of electrons into the charge accumulation part (herein, the insulation film MZ2) in the insulation film MZ of the memory transistor is defined as "write", and injection of holes is defined as "erase". Incidentally, in the table of FIG. 4, the row A corresponds to the case where write is by a SSI method, and erase is by a BTBT method; the row B corresponds to the case where write is by a SSI method, and erase is by a FN method; the row C corresponds to the case where write is by a FN method, and erase is by a BTBT method; and the row D corresponds to the case where write is by a FN method, and erase is by a FN method.

The write methods include a write method in which write is performed by hot electron injection by source side implantation referred to as a so-called SSI (Source Side Injection) method, and a write method in which write is performed by FN (Fowler Nordheim) tunneling referred to as a so-called FN method. The SSI method can be regarded as an operation method of performing write on the memory cell by injecting hot electrons into the insulation film MZ2. The BTBT method can be regarded as an operation method of performing erase on the memory cell by injecting hot holes into the insulation film MZ2. The FN method can be regarded as an operation method of performing write or erase by tunneling of electrons or holes. The FN method can be described in another expression as follows: the write of the FN method can be regarded as an operation method of performing write on the memory cell by injecting electrons into the insulation film MZ2 by the FN tunneling effect; and the erase of the FN method can be regarded as an operation method of performing erase on the memory cell by injecting holes into the insulation film MZ2 by the FN tunneling effect. Below, a description will be given specifically.

For write of the SSI method, for example, the voltages as shown in "Write operation voltage" of the row A or the row B of the table of FIG. 4 are applied to respective sites of the selection memory cell to perform write; thus, electrons are implanted into the insulation film MZ2 of the insulation film MZ of the selection memory cell, thereby to perform write. At this step, hot electrons are generated in the channel region under between two gate electrodes (the memory gate electrode MG and the control gate electrode CG) (between the source and the drain). Thus, hot electrons are implanted into the charge accumulation part (the insulation film MZ2) in the insulation film MZ under the memory gate electrode MG (see FIG. 5). The implanted hot electrons are trapped by the trap level in the insulation film MZ2. As a result, the threshold voltage of the memory transistor increases. Namely, the memory transistor is rendered in a write state.

For write of the FN method, for example, the voltages as shown in "Write operation voltage" of the row C or the row D of the table of FIG. 4 are applied to respective sites of the selection memory cell to perform write; thus, in the selection memory cell, electrons are tunneled from the memory gate electrode MG, and implanted into the insulation film MZ2 of the insulation film MZ, thereby to perform write. At this step, electrons are tunneled from the memory gate electrode MG through the insulation film MZ3 by the FN tunneling (FN tunneling effect), are implanted into the insulation film MZ, and are trapped by the trap level in the insulation film MZ. As a result, the threshold voltage of the memory transistor increases (see FIG. 6). Namely, the memory transistor is rendered in a write state.

Incidentally, in write of the FN method, write can also be performed in the following manner: electrons are tunneled from the semiconductor substrate SB, and are implanted into the insulation film MZ2 in the insulation film MZ. In this case, the write operation voltages can be set at, for example, those obtained by inverting the positive and negative signs of the "write operation voltages" in the row C or the row D of the table of FIG. 4.

The erase methods include an erase method in which erase is performed by hot hole implantation due to BTBT (Band-To-Band Tunneling phenomenon) referred to as a so-called BTBT method, and an erase method in which erase is performed by FN tunneling referred to as a so-called FN method.

For erase of the BTBT method, holes generated by BTBT are implanted into the charge accumulation part (the insulation film MZ2), thereby to perform erase. For example, the voltages as shown in "Erase operation voltage" of the row A or the row C of the table of FIG. 4 are applied to respective sites of the selection memory cell to perform erase. As a result, holes are generated by a BTBT phenomenon, and are accelerated under an electric field. Thus, holes are implanted into the insulation film MZ2 in the insulation film MZ of the selection memory cell. This reduces the threshold voltage of the memory transistor (see FIG. 7). Namely, the memory transistor is rendered in an erase state.

For erase of the FN method, for example, the voltages as shown in "Erase operation voltage" of the row B or the row D of the table of FIG. 4 are applied to respective sites of the selection memory cell to perform erase; thus, in the selection memory cell, holes are tunneled from the memory gate electrode MG, and implanted into the insulation film MZ2 in the insulation film MZ, thereby to perform erase. At this step, holes are tunneled from the memory gate electrode MG through the insulation film MZ3 by the FN tunneling (FN tunneling effect), are implanted into the insulation film MZ, and are trapped by the trap level in the insulation film MZ. This reduces the threshold voltage of the memory transistor (see FIG. 8). Namely, the memory transistor is rendered in an erase state.

Incidentally, in erase of the FN method, erase can also be performed in the following manner: holes are tunneled from the semiconductor substrate SB, and are implanted into the insulation film MZ2 in the insulation film MZ. In this case, the erase operation voltages can be set at, for example, those obtained by inverting the positive and negative signs of the "erase operation voltages" in the row B or the row D of the table of FIG. 4

At the time of read, for example, the voltages as shown in "Read operation voltage" in the row A, the row B, the row C, or the row D of the table of FIG. 8 are applied to respective sites of the selection memory cell to perform read. The voltage Vmg to be applied to the memory gate electrode MG at the time of read is set at a value between the threshold voltage of the memory transistor in a write state and the threshold voltage of the memory transistor in an erase state. As a result, it is possible to discriminate the write state and the erase state.

<Regarding Manufacturing Steps of Semiconductor Device>

Then, a description will be given to a method for manufacturing a semiconductor device of the present embodiment.

FIGS. 9 to 25 are each an essential part cross sectional view of the semiconductor device of the present embodiment during a manufacturing step, and each show a cross sectional view of the region corresponding to the FIG. 1.

Figure 9:
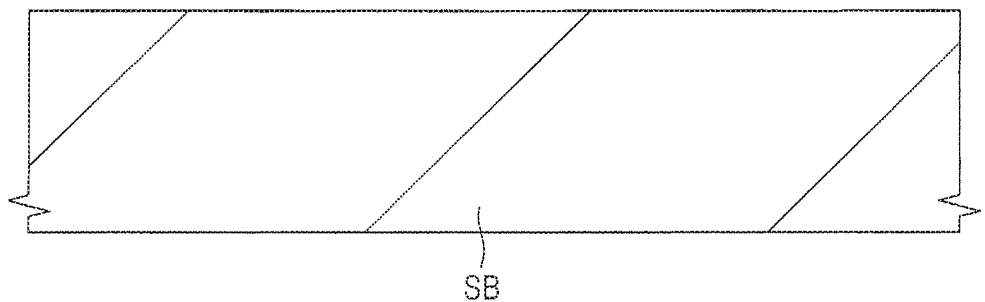
FIG. 9 is an essential part cross sectional view of a semiconductor device of one embodiment of the present invention during a manufacturing step.

As shown in FIG. 9, first, a semiconductor substrate (semiconductor wafer) SB formed of, for example, a p type single crystal silicon having a specific resistance of about 1 to 10 Ωcm is prepared (provided). Then, in the main surface of the semiconductor substrate SB, an element isolation region (not shown) for defining (partitioning) an active region is formed. The element isolation region ST is formed of an insulator (insulation film) of silicon oxide, or the like, and can be formed by, for example, a STI (Shallow Trench Isolation) method.

Figure 10:
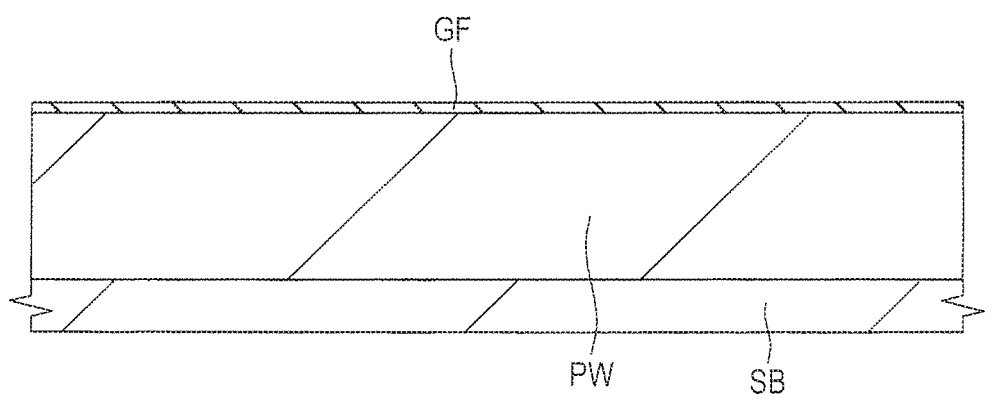
FIG. 10 is an essential part cross sectional view of the semiconductor device during a manufacturing step following FIG. 9.

Then, as shown in FIG. 10, a p type well PW is formed in the semiconductor substrate SB. The p type well PW can be formed by ion implanting a p type impurity such as boron (B) into the semiconductor substrate SB, and is formed to a prescribed depth from the main surface of the semiconductor substrate SB.

Then, in order to adjust the threshold voltage of the control transistor to be formed later, if required, channel dope ion implantation is performed on the surface layer part of the p type well PW.

Then, the surface of the semiconductor substrate SB (p type well PW) is cleaned by diluted hydrofluoric acid cleaning, or the like. Then, at the main surface of the semiconductor substrate SB (the surface of the p type well PW), an insulation film GF for a gate insulation film is formed. FIG. 10 shows this stage.

The insulation film GF is formed of, for example, a silicon oxide film, and can be formed using a thermal oxidation method, or the like. The formation film thickness of the insulation film GF can be set at, for example, about 2 to 3 nm.

Figure 11:
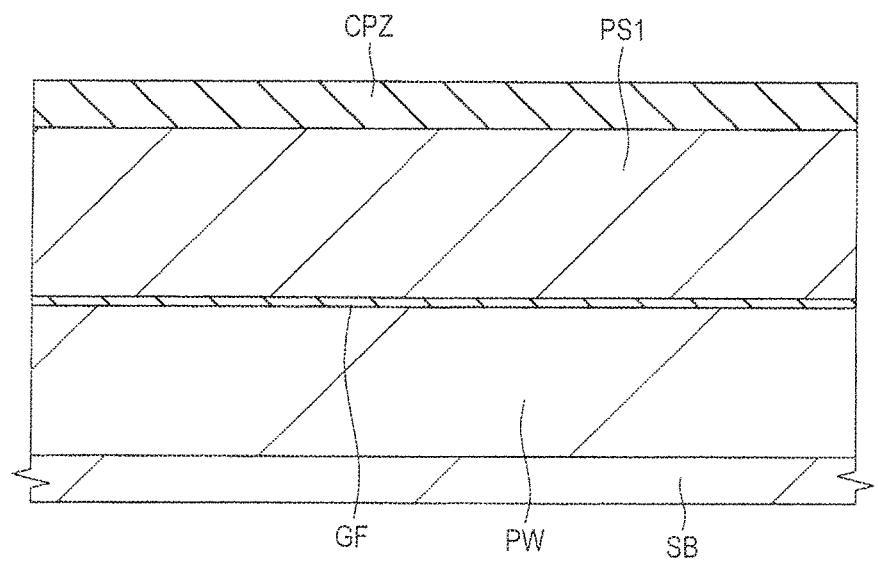
FIG. 11 is an essential part cross sectional view of the semiconductor device during a manufacturing step following FIG. 10.

Then, as shown in FIG. 11, over the main surface (the entire main surface) of the semiconductor substrate SB, namely, over the insulation film GF, a silicon film PS1 is formed (deposited) as a conductive film for forming the control gate electrode CG.

The silicon film PS1 is formed of a polycrystal silicon film (polysilicon film), and can be formed using a CVD (Chemical Vapor Deposition) method, or the like. The film thickness (deposited film thickness) of the silicon film PS1 can be set at, for example, about 140 nm. The following is also possible: during deposition, the silicon film PS1 is formed as an amorphous silicon film; then, by the subsequent heat treatment, the silicon film PS1 formed of an amorphous silicon film is changed into the silicon film PS1 formed of a polycrystal silicon film.

The silicon film PS1 is doped with an n type impurity by ion implantation after deposition, or doped with an n type impurity during deposition by a depositing gas, and thereby can be formed into a low-resistivity doped polysilicon film.

Then, over the main surface (the entire main surface) of the semiconductor substrate SB, namely, over the silicon film PS1, an insulation film CPZ for forming the cap insulation film CP is formed.

The insulation film CPZ is formed of, for example, a silicon nitride film. As the insulation film CPZ, a lamination film of a silicon oxide film, and a silicon nitride film formed over the silicon oxide film, and thicker than the silicon oxide film can also be used. The film thickness (deposited film thickness) of the insulation film CPZ can be set at, for example, about 50 nm.

Figure 12:
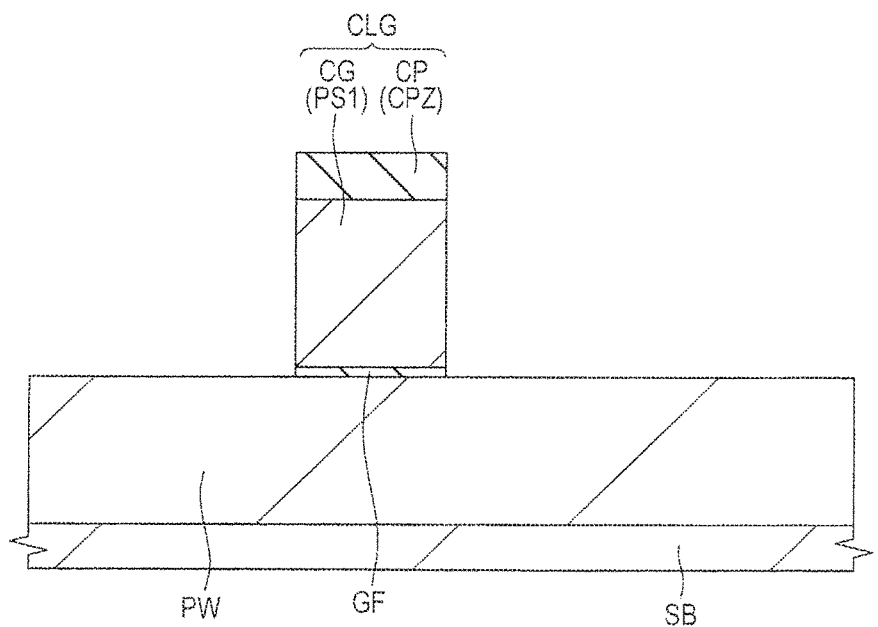
FIG. 12 is an essential part cross sectional view of the semiconductor device during a manufacturing step following FIG. 11.

Then, as shown in FIG. 12, the lamination film of the silicon film PS1 and the insulation film CPZ over the silicon film PS1 is patterned using a photolithography technology and an etching technology. As a result, a control gate CLG is formed.

The control gate CLG has a lamination structure of the control gate electrode CG and the cap insulation film CP over the control gate electrode CG. The control gate electrode CG is formed of a patterned silicon film PS1, and the cap insulation film CP is formed of a patterned insulation film CPZ. The portion of the insulation film GF left under the control gate CLG serves as the gate insulation film of the control transistor. Therefore, the control gate electrode CG is formed over the semiconductor substrate SB (p type well PW) via the insulation film GF as the gate insulation film. The portions of the insulation film GF except for the portion thereof covered with the control gate electrode CG can be removed by performing dry etching performed in the step of patterning the lamination film of the silicon film PS1 and the insulation film CPZ, or wet etching after the dry etching.

Then, in order to adjust the threshold voltage of the memory transistor to be formed later, if required, channel dope ion implantation is performed on the surface layer part of the p type well PW.

Figure 13:
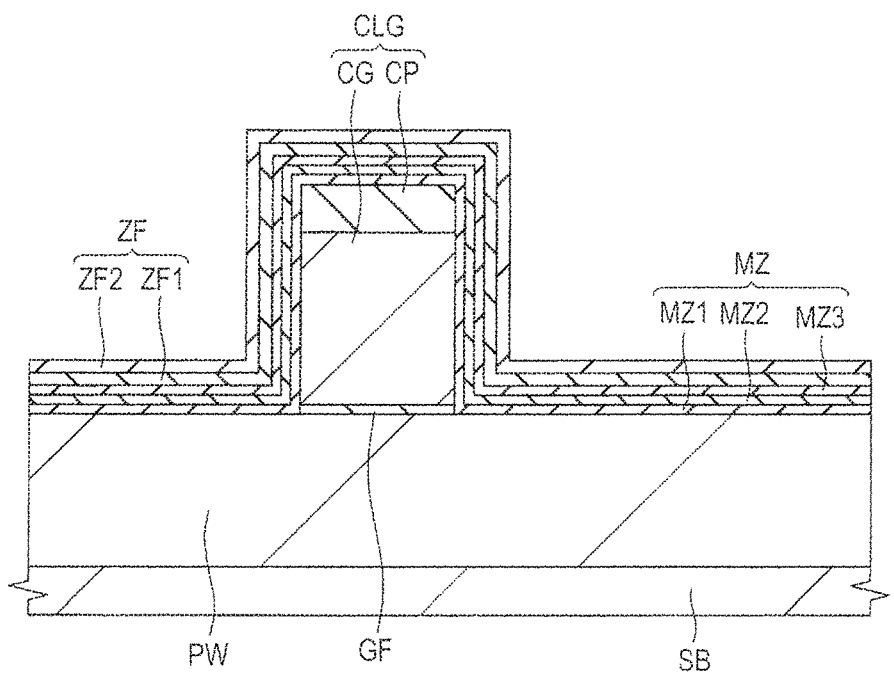
FIG. 13 is an essential part cross sectional view of the semiconductor device during a manufacturing step following FIG. 12.

Then, a cleaning treatment is performed, thereby to subject the main surface of the semiconductor substrate SB to a purification treatment. Then, as shown in FIG. 13, over the entire main surface of the semiconductor substrate SB, namely, over the main surface (surface) of the semiconductor substrate SB, and over the surface (the top surface and the side surfaces) of the control gate CLG, an insulation film MZ for the gate insulation film of the memory transistor is formed, and an insulation film ZF is formed over the insulation film MZ. As a result, a lamination film of the insulation film MZ, and the insulation film ZF over the insulation film MZ is formed over the semiconductor substrate SB in such a manner as to cover the control gate CLG.

The insulation film MZ is an insulation film for the gate insulation film of the memory transistor, and is an insulation film having a charge accumulation layer (charge accumulation part) in the inside thereof. The insulation film MZ is formed of a lamination film (lamination insulation film) having an insulation film MZ1, an insulation film MZ2 formed over the insulation film MZ1, and an insulation film MZ3 formed over the insulation film MZ2. The insulation film ZF is formed of a lamination film of a insulation film ZF1, and an insulation film ZF2 formed over the insulation film ZF1. Accordingly, performing of the insulation film MZ formation step and the insulation film ZF formation step corresponds to performing of the insulation film MZ1 formation step, the insulation film MZ2 formation step, the insulation film MZ3 formation step, the insulation film ZF1 formation step, and the insulation film ZF2 formation step. Herein, the insulation film MZ1, the insulation film MZ3, and the insulation film ZF2 each can be formed of a silicon oxide film (oxide film). The insulation film MZ2 and the insulation film ZF1 each can be formed of a silicon nitride film (nitride film).

The insulation film MZ or ZF formation step can be performed, for example, in the following manner.

First, the insulation film MZ1 formed of a silicon oxide film is formed by a thermal oxidation method; then, over the insulation film MZ1, the insulation film MZ2 formed of a silicon nitride film is deposited by a CVD method; and further, over the insulation film MZ2, the insulation film MZ3 formed of a silicon oxide film is formed by a CVD method or a thermal oxidation method, or both thereof. Then, over the insulation film MZ3, the insulation film ZF1 formed of a silicon nitride film is deposited by a CVD method, and further, over the insulation film ZF1, the insulation film ZF2 formed of a silicon oxide film is formed by a CVD method or a thermal oxidation method, or both thereof. In this manner, the lamination film of the insulation film MZ1 (silicon oxide film), the insulation film MZ2 (silicon nitride film) over the insulation film MZ1, the insulation film MZ3 (silicon oxide film) over the insulation film MZ2, the insulation film ZF1 (silicon nitride film) over the insulation film MZ3, and the insulation film ZF2 (silicon oxide film) over the insulation film ZF1 is formed over the semiconductor substrate SB in such a manner as to cover the control gate CLG. Namely, the lamination film of the insulation films MZ (insulation films MZ1, MZ2, and MZ3), and the insulation film ZF (insulation films ZF1 and ZF2) over the insulation film MZ is formed over the semiconductor substrate SB in such a manner as to cover the control gate CLG.

In other words, in the step of FIG. 13, the insulation film MZ is formed over the semiconductor substrate SB in such a manner as to cover the control gate CLG. Then, over the insulation film MZ, the insulation film ZF2 is formed. Further, the insulation film ZF2 is formed over the insulation film ZF1.

The thickness of the insulation film MZ1 can be set at, for example, about 3 to 10 nm. The thickness of the insulation film MZ2 can be set at, for example, about 4 to 12 nm. The thickness of the insulation film MZ3 can be set at, for example, about 5 to 15 nm. Whereas, the thickness of the insulation film ZF1 can be set at, for example, about 3 to 10 nm. The thickness of the insulation film ZF2 can be set at, for example, about 3 to 10 nm. When the thickness of the insulation film ZF1 is set at about 3 to 10 nm, and the thickness of the insulation film ZF2 is set at about 3 to 10 nm, the thickness of the insulation film ZF becomes about 6 to 20 nm.

Figure 14:
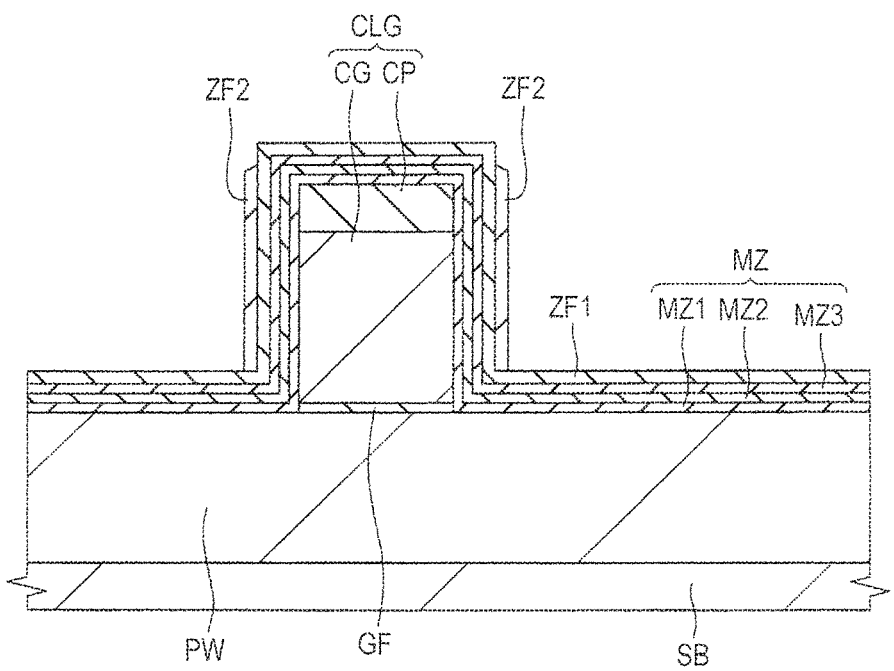
FIG. 14 is an essential part cross sectional view of the semiconductor device during a manufacturing step following FIG. 13.

Then, as shown in FIG. 14, the insulation film ZF2 is anisotropically etched (etched back), thereby to expose the insulation film ZF1, and to leave the insulation film ZF2 over the side surface of the selection gate CLG via the insulation film MZ and the insulation film ZF1. Namely, the insulation film ZF2 is anisotropically etched (etched back), so that the insulation film MZ2 is selectively left in a sidewall spacer (sidewall insulation film) shape over the side surface of the control gate CLG via the insulation film MZ and the insulation film ZF1, and other portions of the insulation film ZF2 are removed, thereby to expose the insulation film ZF1. This etching step (etch back step) will be hereinafter referred to as the "etching step of FIG. 14".

In the etching step of FIG. 14, using anisotropic dry etching, the insulation film ZF2 is etched (anisotropically etched) under the conditions in which the insulation film ZF1 is less likely to be etched than the insulation film ZF2. Namely, in the etching step of FIG. 14, the insulation film ZF2 is etched (anisotropically etched) under the conditions in which the etching rate of the insulation film ZF1 is lower than the etching rate of the insulation film ZF2. For this reason, in the etching step of FIG. 14, the insulation film ZF1 can function as an etching stopper.

Figure 15:
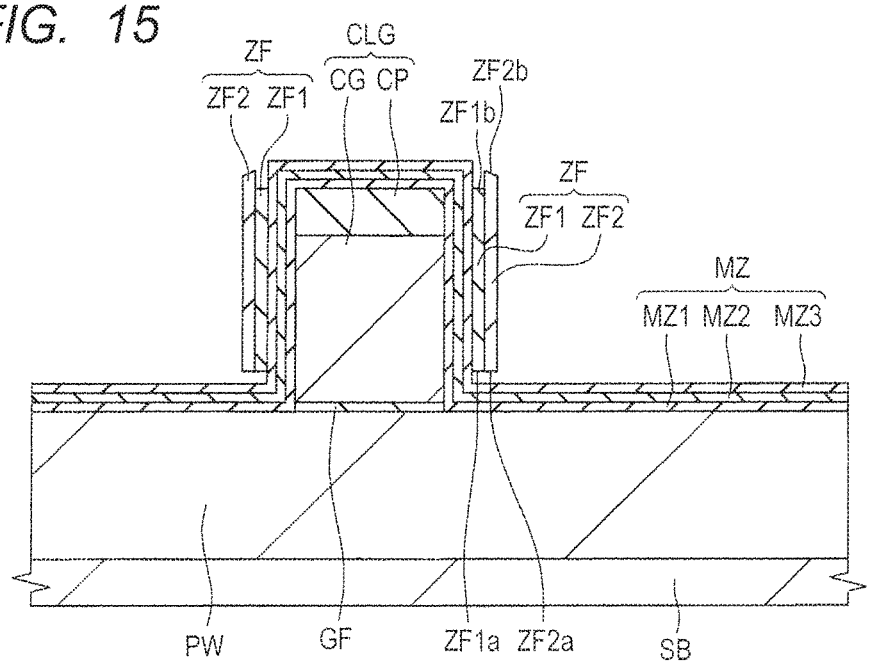
FIG. 15 is an essential part cross sectional view of the semiconductor device during a manufacturing step following FIG. 14.

Then, as shown in FIG. 15, the insulation film ZF1 is etched. This etching step will be hereinafter referred to as the "etching step of FIG. 15". In the etching step of FIG. 15, the insulation film ZF2 is isotropically etched. As a result, the insulation film MZ is exposed, and the insulation film ZF1 and the insulation film ZF2 are left over the side surface of the control gate CLG via the insulation film MZ. At this step, the portion of the insulation film ZF1 extending in such a manner as to be along the main surface of the semiconductor substrate SB is removed by isotropic etching.

In the etching step of FIG. 15, using isotropic etching (dry etching or wet etching), the insulation film ZF1 is etched (isotropically etched) under the conditions in which the insulation films ZF2 and MG3 are less likely to be etched than the insulation film ZF1. Namely, in the etching step of FIG. 15, the insulation film ZF1 is etched (isotropically etched) under the conditions in which each etching rate of the insulation films ZF2 and MG3 is lower than the etching rate of the insulation film ZF1. For this reason, in the etching step of FIG. 15, the insulation film ZF2 can function as a mask (etching mask), and the insulation film MZ3 can function as an etching stopper. In the etching step of FIG. 15, wet etching can be preferably used. However, when the insulation film ZF1 is a silicon nitride film, and the insulation films ZF2 and MG3 are each a silicon oxide film, phosphoric acid or the like can be used as an etchant.

The etching step of FIG. 15 is performed. As a result, the portion of the insulation film ZF1 interposed between the insulation film MZ (MZ3) and the insulation film ZF2 is not etched, and is left. However, the portions of the insulation film ZF1 except for the portion thereof interposed between the insulation film MZ (MZ3) and the insulation film ZF2 are etched and removed. Further, in the etching step of FIG. 15, isotropic etching is performed. As a result, the insulation film ZF1 is side etched. Accordingly, the portion of the insulation film ZF1 situated under the lower end face ZF2*a* of the insulation film ZF2 is also etched (side etched), and is removed. Further, side etching of the insulation film ZF1 proceeds, so that the portion of the insulation film ZF1 extending in the horizontal direction (the direction in parallel with the main surface of the semiconductor substrate SB) in such a manner as to be along the main surface of the semiconductor substrate SB is etched and removed.

Figure 16:
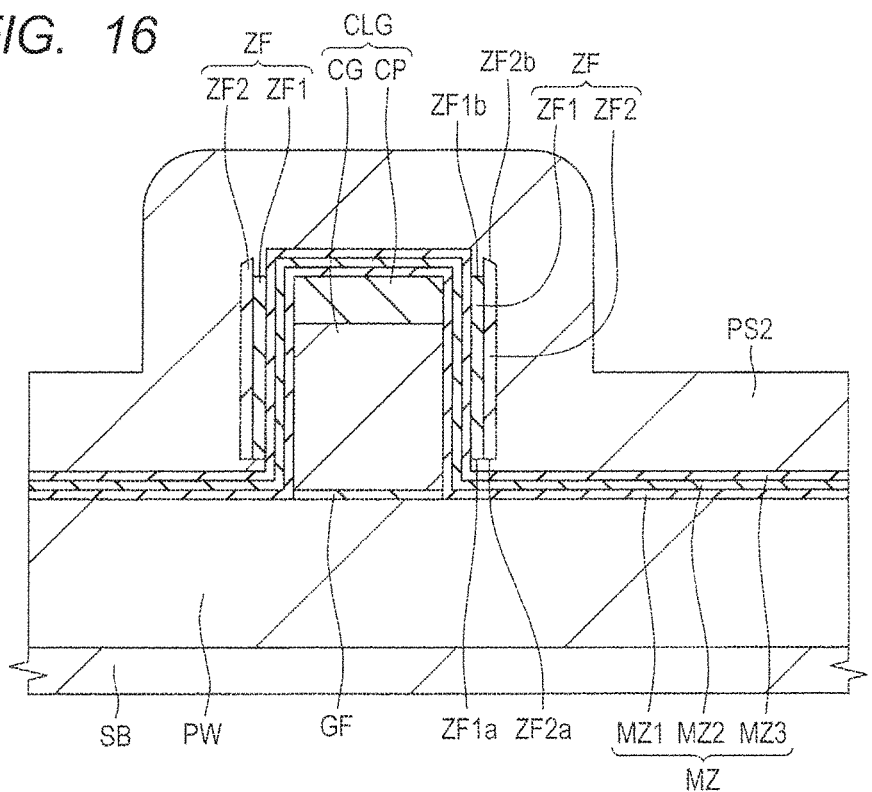
FIG. 16 is an essential part cross sectional view of the semiconductor device during a manufacturing step following FIG. 15.

Accordingly, at the stage upon completion of the etching step of FIG. 15, the lower end face ZF1*a* of the insulation film ZF1, and the lower end face ZF2*a* of the insulation film ZF2 are separated from the portion of the top surface (the top surface of the insulation film MZ3) of the insulation film MZ extending in the horizontal direction (direction in parallel with the main surface of the semiconductor substrate SB) in such a manner as to be along the main surface of the semiconductor substrate SB. Namely, at the stage upon completion of the etching step of FIG. 15, in the height direction, a gap (space) is present between the lower end faces ZF1*a* and ZF2*a* of the insulation films ZF1 and ZF2 and the insulation film MZ. In the step of FIG. 16 described later, a silicon film PS2 is formed so that the silicon film PS2 is also filled in the gap.

Then, as shown in FIG. 16, over the main surface (entire main surface) of the semiconductor substrate SB, namely, over the insulation film MZ and the insulation film ZF, the silicon film PS2 is formed (deposited) as a conductive film for forming the memory gate electrode MG in such a manner as to cover the control gate CLG.

The silicon film PS2 is formed of a polycrystal silicon film, and can be formed using a CVD method, or the like. The film thickness (deposited film thickness) of the silicon film PS2 can be set at, for example, about 30 to 100 nm. The deposited film thickness of the silicon film PS2 is set according to the design value of the gate length of the memory gate electrode MG to be formed later. The following is also possible: during deposition, the silicon film PS2 is formed as an amorphous silicon film; then, by the subsequent heat treatment, the silicon film PS2 formed of an amorphous silicon film is changed into the silicon film PS2 formed of a polycrystal silicon film. When the silicon film PS2 is formed, the gap (space) between the lower end faces ZF1*a* and ZF2*a* of the insulation films ZF1 and ZF2 and the insulation film MZ (MZ3) in the height direction is filled with the silicon film PS2. For this reason, when the memory gate electrode MG is formed in the step of FIG. 17 described later, a part of the memory gate electrode MG is present under the lower end faces ZF1*a* and ZF2*a* of the insulation films ZF1 and ZF2.

The silicon film PS2 is doped with an n type impurity by ion implantation after deposition, or doped with an n type impurity during deposition by a depositing gas, and thereby can be formed into a low-resistivity doped polysilicon film.

Figure 17:
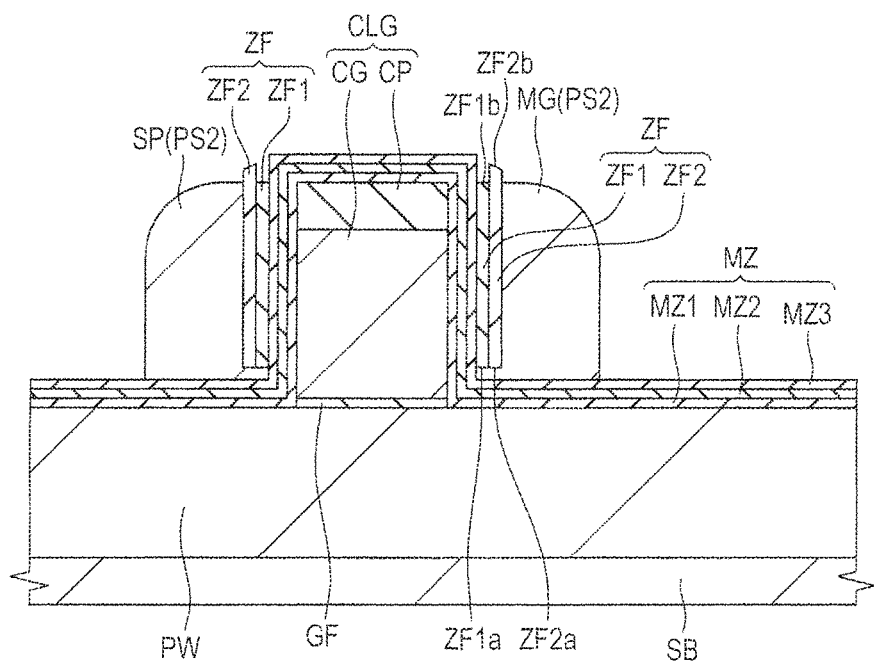
FIG. 17 is an essential part cross sectional view of the semiconductor device during a manufacturing step following FIG. 16.

Then, as shown in FIG. 17, by an anisotropical etching technology, the silicon film PS2 is etched back. The etching step (etch back step) will be hereinafter referred to as the "etching step of FIG. 17".

In the etching step of FIG. 17, the silicon film PS2 is anisotropically etched (etched back) by the deposited film thickness of the silicon film PS2. As a result, the silicon film PS2 is left in a sidewall spacer shape over the side surface of the control gate CLG via the insulation films MZ and ZF, and the portions of the silicon film PS2 in other regions are removed. As a result, as shown in FIG. 17, over one side surface of both the side surfaces of the control gate CLG, the memory gate electrode MG is formed via the insulation film MZ and the insulation film ZF, and over the other side surface thereof, a silicon spacer SP is formed via the insulation film MZ and the insulation film ZF. The memory gate electrode MG is formed of the silicon film PS2 left in a sidewall spacer shape over one side surface of the control gate CLG via the insulation films MZ and ZF. The silicon spacer SP is formed of the silicon film PS2 left in a sidewall spacer shape over one side surface of the control gate CLG via the insulation films MZ and ZF. The memory gate electrode MG is formed over the insulation film MZ in such a manner as to be adjacent to the control gate CLG via the insulation films MZ and ZF. The silicon spacer SP can also be regarded as a sidewall spacer formed of a conductor, namely, a conductor spacer. The memory gate electrode MG and the silicon spacer SP are formed over the side surfaces of the control gate CLG opposite to each other, and have a nearly symmetric structure with the control gate electrode CG interposed therebetween. In the etching step of FIG. 17, using anisotropic dry etching, the silicon film PS2 is etched under the etching conditions in which the insulation film MZ3 is less likely to be etched than the silicon film PS2. Accordingly, in the etching step of FIG. 17, the insulation film MZ3 can function as an etching stopper.

At the stage upon completion of the etching step of FIG. 17, the portion of the insulation film MZ in the region not covered with the memory gate electrode MG and the silicon spacer SP is exposed. The insulation film MZ is interposed between the memory gate electrode MG and the semiconductor substrate SB (p type well PW), and between the memory gate electrode MG and the control gate CLG. Whereas, the insulation film ZF is also interposed between the memory gate electrode MG and the control gate CLG, but the insulation film ZF is not interposed between the memory gate electrode MG and the semiconductor substrate SB (p type well PW). The portion of the insulation film MZ under the memory gate electrode MG serves as the gate insulation film of the memory transistor. When the silicon film PS2 is formed in the step of FIG. 16, the deposited film thickness of the silicon film PS2 is adjusted. As a result, the memory gate length (the gate length of the memory gate electrode MG) can be adjusted.

Further, at the stage upon completion of the etching step of FIG. 15, the upper end face ZF1$b$ of the insulation film ZF1 may be lower than the upper end face ZF2$b$ of the insulation film ZF2 (see FIG. 15). Herein, the upper end face ZF1$b$ of the insulation film ZF1 is the end face (the end) of the insulation film ZF1 opposite to the lower end face ZF1$a$. The upper end face ZF2$b$ of the insulation film ZF2 is the end face (the end) of the insulation film ZF2 opposite to the lower end face ZF2$a$. In this case, when the silicon film PS is formed, the gap surrounded by the upper end face ZF1$b$ of the insulation film ZF1, the side surface of the insulation film MZ, and the side surface of the insulation film ZF2 is filled with the silicon film PS (see FIG. 16). In this case, when the silicon film PS is etched back in the etching step of FIG. 17, the polysilicon film PS is desirably etched back so as to prevent the silicon film PS from being left over the upper end face ZF2$b$ of the insulation film ZF2. As a result, it becomes possible to perform the subsequent steps with more precision. Further, it becomes possible to prevent unnecessary etching residue from being generated in the subsequent steps with more precision.

Figure 18:
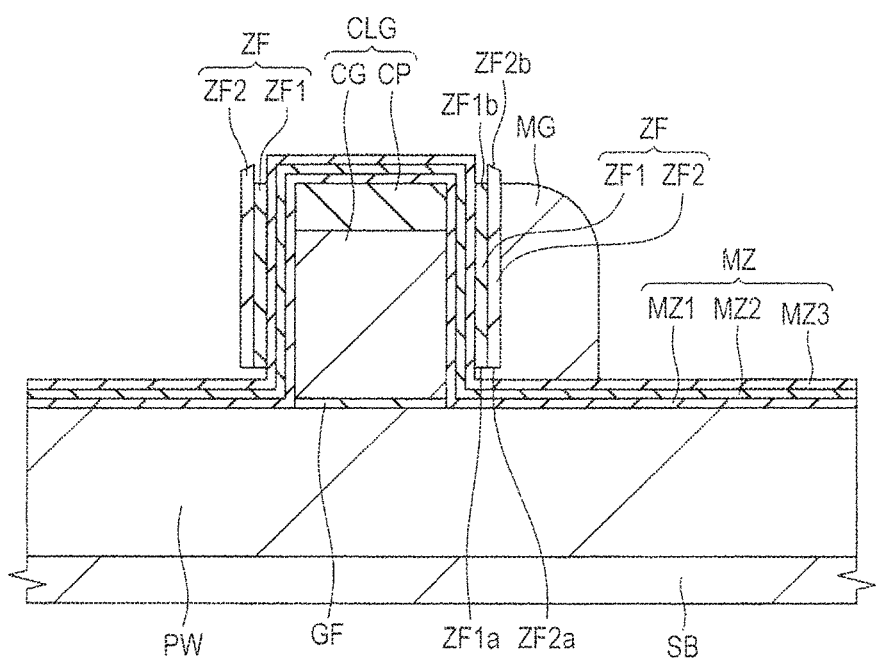
FIG. 18 is an essential part cross sectional view of the semiconductor device during a manufacturing step following FIG. 17.

Then, using a photolithography technology, such a photoresist pattern (not shown) as to cover the memory gate electrode MG, and to expose the silicon spacer SP is formed over the semiconductor substrate SB. Then, by dry etching using the photoresist pattern as an etching mask, the silicon spacer SP is removed. Then, the photoresist pattern is removed. As a result, as shown in FIG. 18, the silicon spacer SP is removed. However, the memory gate electrode MG has been covered with the photoresist pattern, and hence is left without being etched.

Figure 19:
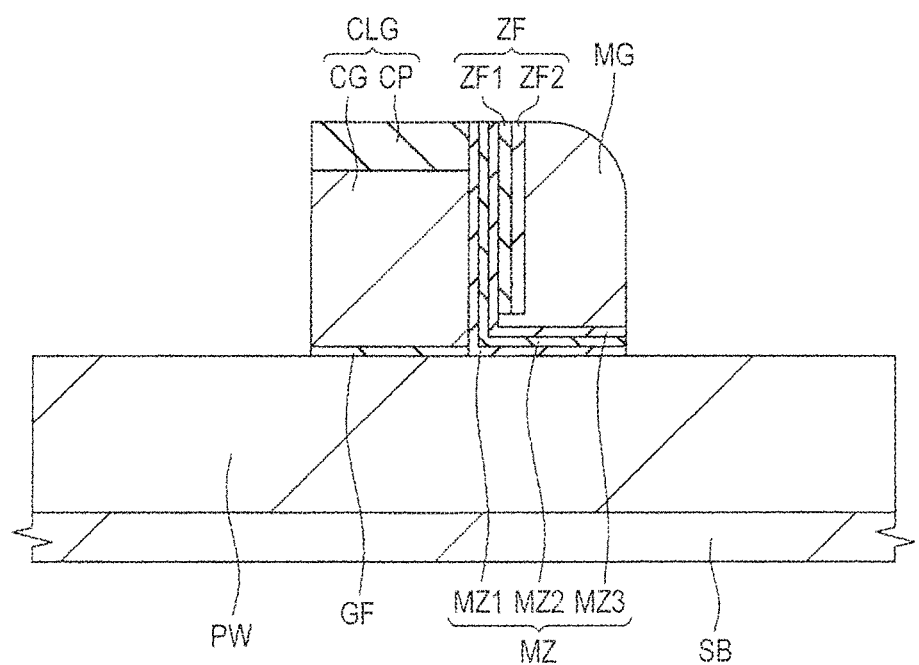
FIG. 19 is an essential part cross sectional view of the semiconductor device during a manufacturing step following FIG. 18.

Then, as shown in FIG. 19, the portions of the insulation films ZF and MZ exposed without being covered with the memory gate electrode MG are removed by etching (e.g., wet etching). The etching step will be hereinafter referred to as the "etching step of FIG. 19". In the etching step of FIG. 19, the portion of the insulation film ZF situated between the memory gate electrode MG and the control gate CLG is not removed, and is left, and the portions of the insulation film ZF in other regions are removed. Further, in the etching step of FIG. 19, the portions of the insulation film MZ situated under the memory gate electrode MG, and between the memory gate electrode MG and the control gate CLG are not removed, and are left, and the portions of the insulation film MZ in other regions are removed. Also indicated from FIG. 19, the insulation film MZ continuously extend across both the regions of the region between the memory gate electrode MG and the semiconductor substrate SB (p type well PW), and the region between the memory gate electrode MG and the control gate CLG. Whereas, the insulation film ZF is not interposed between the memory gate electrode MG and the semiconductor substrate SB (p type well PW). However, not only the insulation film MZ but also the insulation film ZF are interposed between the memory gate electrode MG and the control gate CLG. Accordingly, a lamination structure (lamination film) of the insulation film MZ and the insulation film ZF is interposed between the memory gate electrode MG and the control gate CLG.

Figure 20:
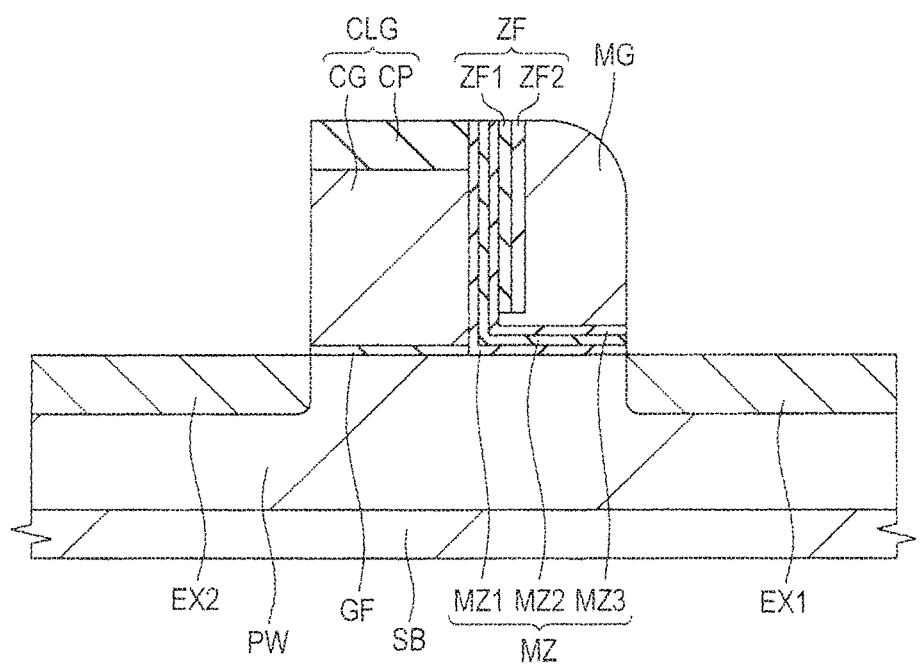
FIG. 20 is an essential part cross sectional view of the semiconductor device during a manufacturing step following FIG. 19.

Then, as shown in FIG. 20, n⁻ type semiconductor regions (impurity diffusion layers) EX1 and EX2 are formed using an ion implantation method or the like. An n type impurity such as arsenic (As) or phosphorus (P) is ion implanted into the semiconductor substrate SB (p type well PW) using the control gate CLG and the memory gate electrode MG as a mask (ion implantation inhibiting mask). As a result, the n⁻ type semiconductor regions EX1 and EX2 can be formed.

At this step, the n⁻ type semiconductor region EX1 is formed in self-alignment with the side surface of the memory gate electrode MG (the side surface opposite to the side thereof adjacent to the control gate CLG via the insulation films MZ and ZF). Whereas, the n⁻ type semiconductor region EX2 is formed in self-alignment with the side surface of the control gate CLG (the side surface opposite to the side thereof adjacent to the memory gate electrode MG via the insulation films MZ and ZF). The n⁻ type semiconductor region EX1 and the n⁻ type semiconductor region EX2 can function as a part of the source/drain region (source or drain region) of the memory cell. The n⁻ type semiconductor region EX1 and the n⁻ type semiconductor region EX2 can be formed by the same ion implantation step, but can also be formed by different ion implantation steps.

Figure 21:
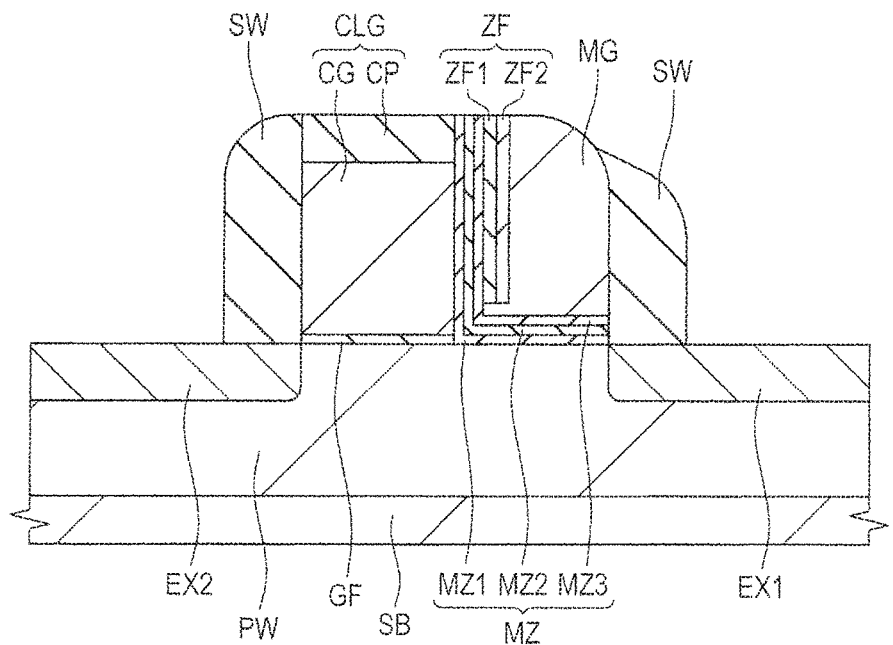
FIG. 21 is an essential part cross sectional view of the semiconductor device during a manufacturing step following FIG. 20.

Then, as shown in FIG. 21, sidewall spacers (sidewalls or sidewall insulation films) SW formed of an insulation film (a silicon oxide film or a silicon nitride film, or a lamination film thereof) are formed at the side surfaces of the control gate CLG and the memory gate electrode MG (the side surfaces opposite to the sides thereof adjacent to each other via the insulation films MZ and ZF).

The sidewall spacer SW formation step can be performed, for example, in the following manner. Namely, over the entire main surface of the semiconductor substrate SB, a sidewall spacer SW forming insulation film is deposited using a CVD method or the like. The sidewall spacer SW forming insulation film is formed of, for example, a silicon oxide film or a silicon nitride film, or a lamination film thereof. Then, the sidewall spacer SW forming insulation film is anisotropically etched (etched back). As a result, the insulation film (sidewall spacer SW forming insulation film) is selectively left over the side surfaces of the control gate CLG and the memory gate electrode MG (the side surfaces opposite to the sides thereof adjacent to each other via the insulation films MZ and ZF), thereby to form the sidewall spacers SW. The sidewall spacers SW are formed over the side surface of both the side surfaces of the control gate CLG opposite to the side surface thereof adjacent to the memory gate electrode MG via the insulation films MZ and ZF, and over the side surface of both the side surfaces of the memory gate electrode MG opposite to the side surface thereof adjacent to the control gate CLG via the insulation films MZ and ZF.

Figure 22:
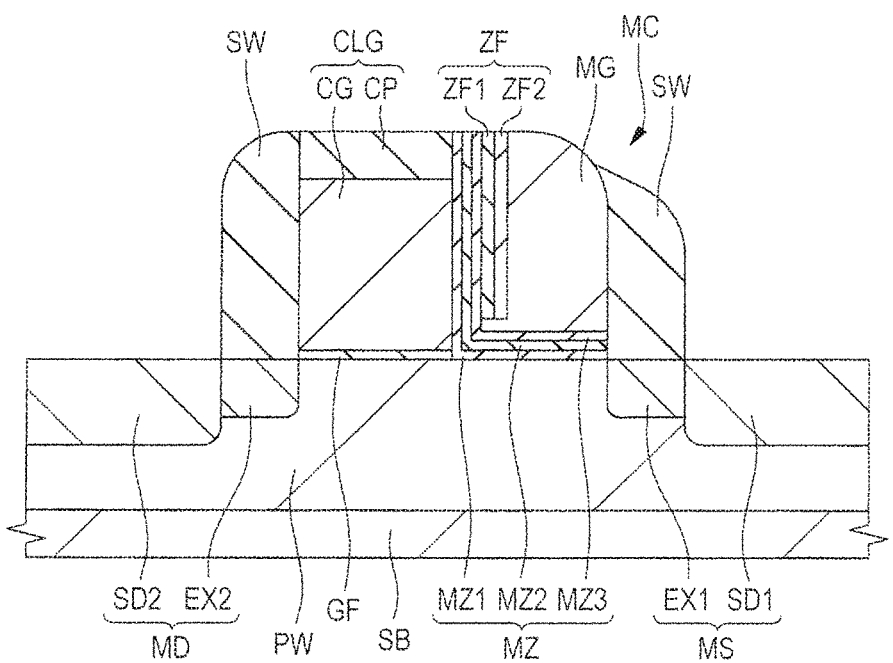
FIG. 22 is an essential part cross sectional view of the semiconductor device during a manufacturing step following FIG. 21.

Then, as shown in FIG. 22, the $n^+$ type semiconductor regions (impurity diffusion layers) SD1 and SD2 are formed using an ion implantation method or the like. An n type impurity such as arsenic (As) or phosphorus (P) is ion implanted into the semiconductor substrate SB (p type well PW) using the control gate CLG, the memory gate electrode MG, and the sidewall spacers SW as a mask (ion implantation inhibiting mask). As a result, the $n^+$ type semiconductor regions SD1 and SD2 can be formed.

At this step, the $n^+$ type semiconductor region SD1 is formed in self-alignment with the sidewall spacer SW over the side surface of the memory gate electrode MG. Whereas, the $n^+$ type semiconductor region SD2 is formed in self-alignment with the sidewall spacer SW formed over the side surface of the control gate CLG. This results in the formation of a LDD structure. The $n^+$ type semiconductor region SD1 and the $n^+$ type semiconductor region SD2 can be formed by the same ion implantation step, but can also be formed by different ion implantation steps.

In this manner, the $n^-$ type semiconductor region EX1, and the $n^+$ type semiconductor region SD1 having a higher impurity density than that form an n type semiconductor region MS functioning as the source region of the memory transistor. The $n^-$ type semiconductor region EX2, and the $n^+$ type semiconductor region SD2 having a higher impurity density than that form an n type semiconductor region MD functioning as the drain region of the control transistor.

Then, activating annealing which is a heat treatment for activating the impurity doped in the semiconductor regions (the $n^-$ type semiconductor regions EX1 and EX2, and the $n^+$ type semiconductor regions SD1 and SD2 for source and drain), and the like is performed.

In this manner, the memory cell MC of the nonvolatile memory is formed.

Then, a metal silicide layer SL is formed. The metal silicide layer SL can be formed by performing a so-called Salicide: Self Aligned Silicide process. Specifically, the metal silicide layer SL can be formed in the following manner.

Figure 23:
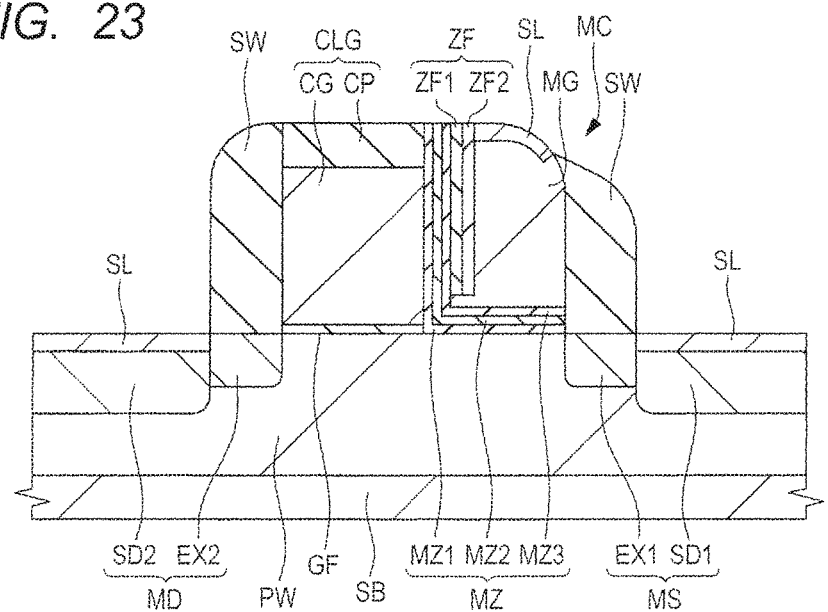
FIG. 23 is an essential part cross sectional view of the semiconductor device during a manufacturing step following FIG. 22.

Namely, first, over the entire main surface of the semiconductor substrate SB including over the top surfaces of the $n^+$ type semiconductor regions SD1 and SD2, a metal film for forming the metal silicide layer SL is formed in such a manner as to cover the control gate CLG, the memory gate electrode MG, and the sidewall spacers SW. The metal film is formed of, for example, a cobalt (Co) film, a nickel (Ni) film, or a nickel platinum alloy film, and can be formed using a sputtering method or the like. Then, the semiconductor substrate SB is subjected to a heat treatment. As a result, respective upper layer portions (surface layer portions) of the $n^+$ type semiconductor regions SD1 and SD2, and the memory gate electrode MG are allowed to react with the metal film for forming the metal silicide layer SL. As a result, as shown in FIG. 23, the metal silicide layers SL are formed at respective tops of the $n^+$ type semiconductor regions SD1 and SD2, and the memory gate electrode MG. Then, unreacted portions of the metal film are removed by wet etching or the like. FIG. 23 shows a cross sectional view at this stage. Further, after removing the unreacted portions of the metal film, a heat treatment can be further performed. The metal silicide layer SL is formed of a cobalt silicide layer, a nickel silicide layer, or a platinum-doped nickel silicide layer, or the like. In the case of FIG. 23, the cap insulation film CP is formed over the control gate electrode CG. Accordingly, the metal silicide layer SL is not formed at the top of the control gate electrode CG. However, as another form, when the cap insulation film CP has not been formed over the control gate electrode CG, the metal silicide layer SL can also be formed at the top of the control gate electrode CG.

Figure 24:
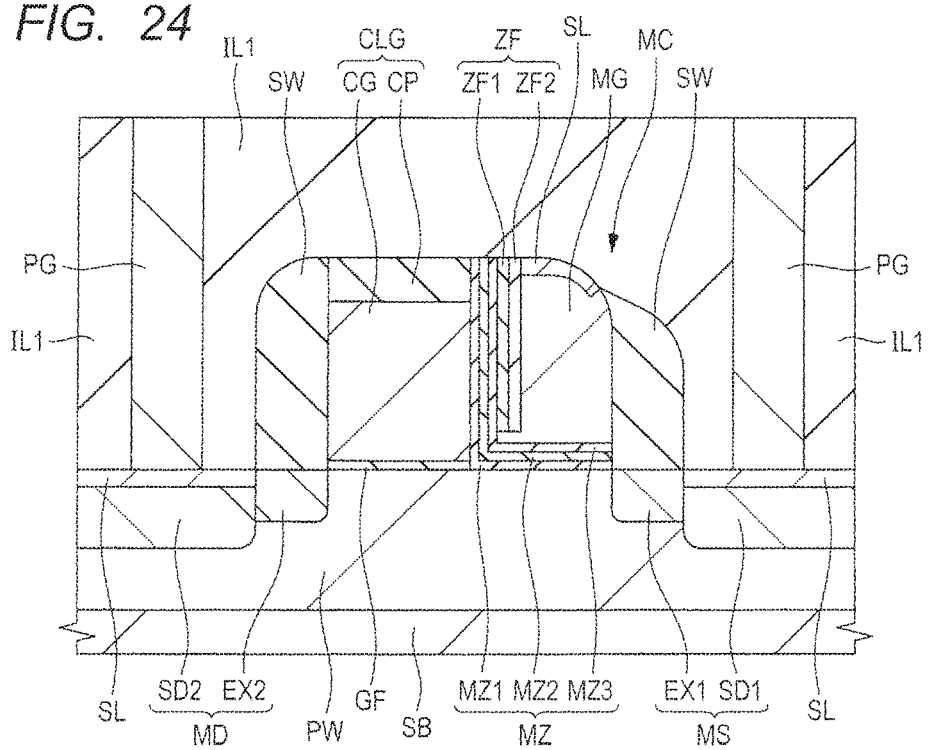
FIG. 24 is an essential part cross sectional view of the semiconductor device during a manufacturing step following FIG. 23.

Then, as shown in FIG. 24, an interlayer insulation film IL1 is formed (deposited) as an insulation film over the entire main surface of the semiconductor substrate SB in such a manner as to cover the control gate CLG, the memory gate electrode MG, and the sidewall spacers SW.

The interlayer insulation film IL1 is formed of a single film of a silicon oxide film, a lamination film of a silicon nitride film, and a silicon oxide film formed over the silicon nitride film, and thicker than the silicon nitride film, or the like, and can be formed using, for example, a CVD method. After formation of the interlayer insulation film IL1, if required, the top surface of the interlayer insulation film IL1 can be planarized using a CMP (Chemical Mechanical Polishing) method, or the like.

Then, the interlayer insulation film IL1 is dry etched using the photoresist pattern (not shown) formed over the interlayer insulation film IL1 with a photolithography method, as an etching mask. As a result, contact holes are formed in the interlayer insulation film IL1. Then, a conductive plug PG formed of tungsten (W) or the like is formed in the contact hole. For example, over the interlayer insulation film IL1 including the contact hole insides, a barrier conductor film and a tungsten film are sequentially formed. Then, unnecessary portions of the main conductor film and the barrier conductor film outside the contact holes are removed by a CMP method, an etch back method, or the like. As a result, plugs PG can be formed. The plugs PG are formed at the tops of the $n^+$ type semiconductor regions SD1 and SD2, the control gate electrode CG, and the memory gate electrode MG, and the like, and are electrically coupled therewith.

Figure 25:
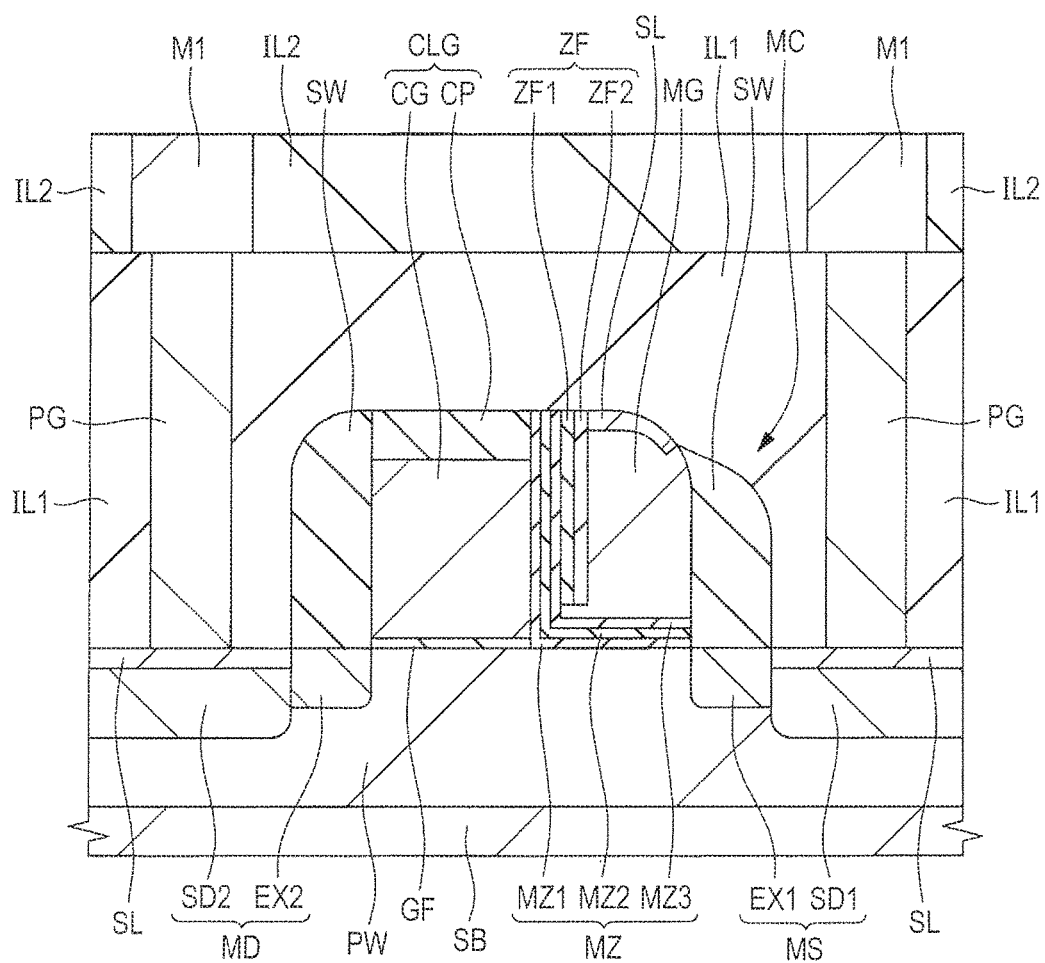
FIG. 25 is an essential part cross sectional view of the semiconductor device during a manufacturing step following FIG. 24.

Then, as shown in FIG. 25, over the insulation film IL1 including the plugs PG embedded therein, an insulation film IL2 is formed. Then, a wire trench is formed in a prescribed region of the insulation film IL2. Then, a wire M1 is embedded in the wire trench using a single damascene technology. The wire M1 is, for example, a copper wire (embedded copper wire) including copper as the main component. The wire M1 is electrically coupled with the $n^+$ type semiconductor regions SD1 and SD2, the control gate electrode CG, the memory gate electrode MG or the like via the plug PG.

Then, by a dual damascene method or the like, second- and more-layer wires are formed. However, herein, they are not shown, and are not described. Further, the wires M1 and upper-layer wires are not limited to damascene wires, and can also be formed by patterning the conductor film for wiring. For example, the wire may be a tungsten wire, an aluminum wire, or the like.

In the manner described up to this point, the semiconductor device of the present embodiment is manufactured.

<Regarding Study Example>

Study Example studied by the present inventors will be described by reference to the accompanying drawings.

Figure 26:
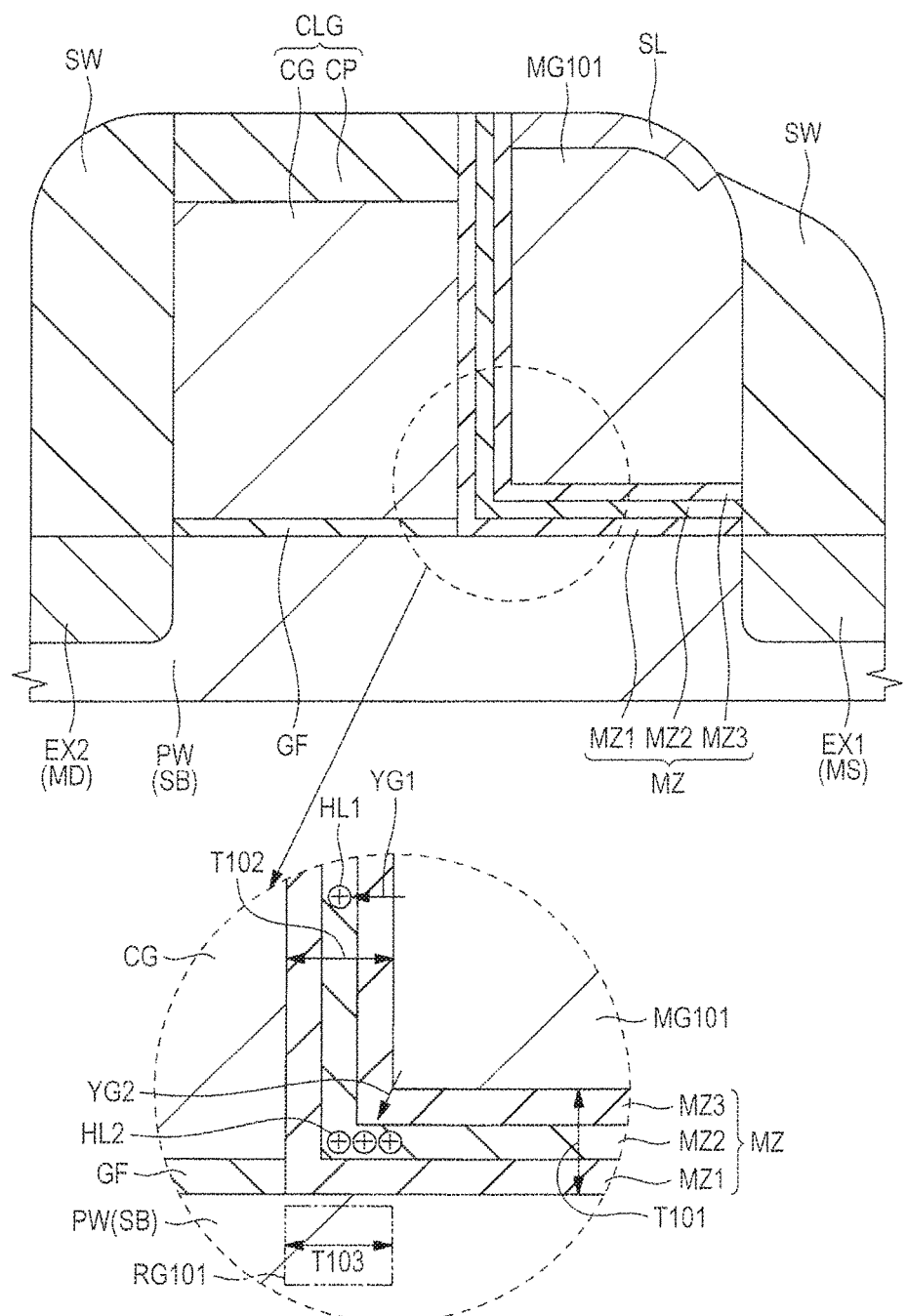
FIG. 26 is an essential part cross sectional view of a semiconductor device of a first study example.

FIG. 26 is an essential part cross sectional view of a semiconductor device of a first study example studied by the present inventors, and corresponds to the FIG. 2.

The semiconductor device of the first study example shown in FIG. 26 is a semiconductor device having the memory cell of a nonvolatile memory, and is different from the semiconductor device of the present embodiment of the FIGS. 1 and 2 in the following points.

Namely, the semiconductor device of the first study example shown in FIG. 26 does not have the one equivalent to the insulation film ZF. Accordingly, in the semiconductor device of the first study example shown in FIG. 26, between the memory gate electrode MG101 corresponding to the memory gate electrode MG and the control gate CLG, an insulation film MZ is interposed, but the insulation film ZF is not interposed.

The insulation film MZ is formed of a lamination film of the insulation films MZ1, MZ2, and MZ3; and the insulation film MZ extends across both the regions of the region between the memory gate electrode MG101 and the semiconductor substrate SB (p type well PW), and the region between the memory gate electrode MG101 and the control gate CLG. In these points, the semiconductor device of the first study example shown in FIG. 26 is the same as the semiconductor device of the present embodiment of the FIGS. 1 and 2.

In the case of the semiconductor device of the first study example shown in FIG. 26, between the control gate electrode CG and the memory gate electrode MG101, the insulation film ZF is not present, and only the insulation film MZ is interposed. In this case, in order to increase the breakdown voltage between the control gate electrode CG and the memory gate electrode MG101, the thickness T102 of the insulation film MZ interposed between the control gate electrode CG and the memory gate electrode MG101 is increased. This also necessarily results in an increase in thickness T101 of the insulation film MZ interposed between the semiconductor substrate SB and the memory gate electrode MG101, which affects the operation of the nonvolatile memory. Namely, in view of the operation of the nonvolatile memory, the thickness T101 of the insulation film MZ interposed between the semiconductor substrate SB and the memory gate electrode MG101 is set at the optimum thickness. This also necessarily prescribes the thickness T102 of the insulation film MZ interposed between the control gate electrode CG and the memory gate electrode MG101. For this reason, it is difficult to increase the thickness T102 of the insulation film MZ interposed between the control gate electrode CG and the memory gate electrode MG101 in order to increase the breakdown voltage between the control gate electrode CG and the memory gate electrode MG101.

For this reason, in the case of the semiconductor device of the first study example shown in FIG. 26, it is difficult to increase the breakdown voltage between the control gate electrode CG and the memory gate electrode MG101.

Further, in the semiconductor device of the first study example shown in FIG. 26, the thickness T102 of the insulation film MZ between the control gate electrode CG and the memory gate electrode MG101 is not thick. Accordingly, when the FN method is used for the erase method, holes tend to be implanted from the memory gate electrode MG101 into the insulation film MZ (MZ2) interposed between the control gate electrode CG and the memory gate electrode MG. Incidentally, with the FN erase method, a positive high voltage is applied to the memory gate electrode (MG, MG101, or MG201), and a lower voltage than that is applied to the p type well PW and the control gate electrode CG (see the FIG. 4). In FIG. 26, the lower-side enlarged view schematically shows the manner in which holes (HL1) are implanted through the path of an arrow YG1 from the memory gate electrode MG101 into the insulation film MZ (MZ2) interposed between the control gate electrode CG and the memory gate electrode MG101. Incidentally, subjectively, holes (HL2) are implanted from the memory gate electrode MG101 into the insulation film MZ (MZ2) through the path of an arrow YG2.

Holes (HL1) are implanted into the insulation film MZ (MZ2) interposed between the control gate electrode CG and the memory gate electrode MG101. This may destabilize the threshold voltage of the memory transistor, and may reduce the retention characteristics (electric charge retaining characteristics). This is because of the following fact: when holes (HL1) are implanted into the insulation film MZ (MZ2) interposed between the control gate electrode CG and the memory gate electrode MG101, the holes (HL1) moves downward in the insulation film MZ with time, and are recombined with the electrons (electrons implanted for write) in the insulation film MZ; this incurs fluctuations in threshold voltage of the memory transistor. For this reason, desirably, the holes (HL1) are prevented from being implanted from the memory gate electrode MG101 into the insulation film MZ (MZ2) through the path of the arrow YG1 as much as possible.

Figure 27:
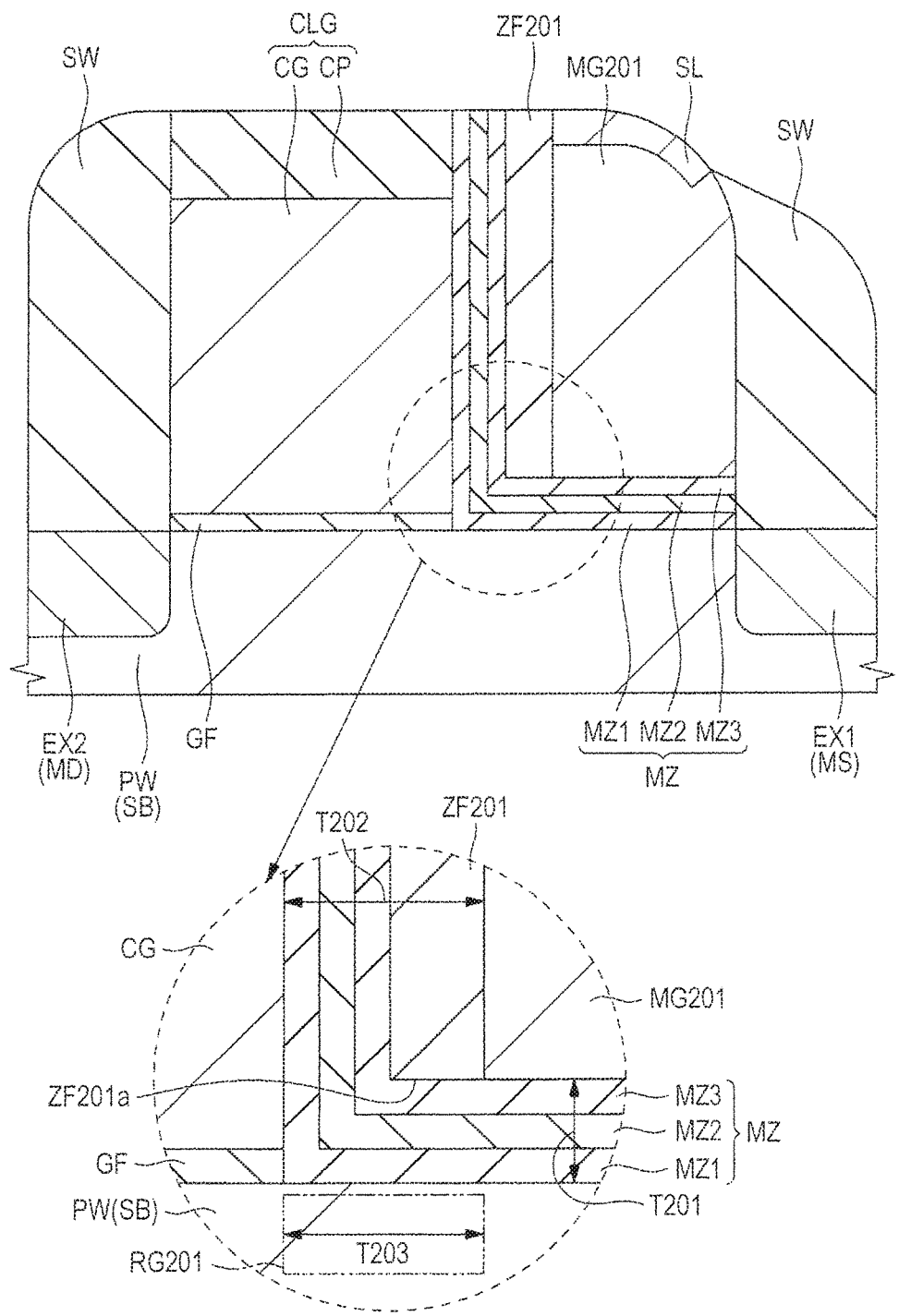
FIG. 27 is an essential part cross sectional view of a semiconductor device of a second study example.

FIG. 27 is an essential part cross sectional view of a semiconductor device of a second study example studied by the present inventors, and corresponds to the FIG. 26.

The semiconductor device of the second study example shown in FIG. 27 is a semiconductor device having the memory cell of a nonvolatile memory, and is different from the semiconductor device of the first study example of the FIG. 26 in the following points.

Namely, in the semiconductor device of the second study example shown in FIG. 27, between a memory gate electrode MG201 corresponding to the memory gate electrode MG101 and the control gate CLG, an insulation film MZ and an insulation film ZF201 are interposed. The insulation film ZF201 is formed of, for example, a silicon nitride film. Between the memory gate electrode MG201 and the control gate CLG, a lamination structure (lamination film) of the insulation film MZ and the insulation film ZF201 is interposed. The insulation film MZ is adjacent to the control gate CLG, and the insulation film ZF201 is adjacent to the memory gate electrode MG201. Further, the insulation film ZF201 is formed of a monolayer insulation film. The lower end face ZF201a of the insulation film ZF201 is in contact with the top surface of the insulation film MZ (MZ3). Accordingly, the memory gate electrode MG201 is not interposed between the lower end face ZF201a of the insulation film ZF201 and the insulation film MZ.

The insulation film MZ is formed of a lamination film of the insulation films MZ1, MZ2, and MZ3; and the insulation film MZ extends across both the regions of the region between the memory gate electrode MG201 and the semiconductor substrate SB (p type well PW), and the region between the memory gate electrode MG201 and the control gate CLG. In these points, the semiconductor device of the second study example shown in FIG. 27 is also the same as the semiconductor device of the first study example shown in FIG. 26.

For manufacturing the semiconductor device of the second study example shown in FIG. 27, for example, the following method can be used. Namely, after obtaining the structure of FIG. 12, over the main surface of the semiconductor substrate SB, and over the surface (the top surface and the side surface) of the control gate CLG, a lamination film of the insulation film MZ1 (silicon oxide film), the insulation film MZ2 (silicon nitride film), the insulation film MZ3 (silicon oxide film), and the insulation film ZF201

(silicon nitride film) is formed. Then, the insulation film ZF201 is anisotropically etched (etched back). As a result, the insulation film ZF201 is selectively left over the side surface of the control gate CLG via the insulation film MZ and the insulation film ZF201, and other portions of the insulation film ZF201 are removed. Then, over the main surface of the semiconductor substrate SB, namely, over the insulation film MZ and the insulation film ZF201, a silicon film equivalent to the silicon film PS2 is formed in such a manner as to cover the control gate CLG. Then, the silicon film is etched back. As a result, the memory gate electrode MG201 can be formed.

In the semiconductor device of the second study example shown in FIG. 27, the insulation film ZF201 is interposed between the control gate CLG and the memory gate electrode MG201, but is not formed under the memory gate electrode MG201. For this reason, even when the thickness of the insulation film ZF201 interposed between the control gate electrode CG and the memory gate electrode MG201 is increased, the thickness of the insulation film (herein, the insulation film MZ) interposed between the memory gate electrode MG201 and the semiconductor substrate SB is not affected.

For this reason, for the semiconductor device of the second study example shown in FIG. 27, the total thickness T202 of the insulation film MZ and the insulation film ZF201 interposed between the control gate electrode CG and the memory gate electrode MG201 can be increased. Specifically, the total thickness T202 of the insulation film MZ and the insulation film ZF201 interposed between the control gate electrode CG and the memory gate electrode MG201 can be set larger than the thickness T201 of the insulation film MZ interposed between the semiconductor substrate SB and the memory gate electrode MG201 (T202>T201). As a result, for the thickness T201 of the insulation film MZ interposed between the semiconductor substrate SB and the memory gate electrode MG201, while ensuring the optimum thickness for the operation of the nonvolatile memory, the total thickness T202 of the insulation films MZ and ZF201 between the control gate electrode CG and the memory gate electrode MG201 is increased. This can improve the breakdown voltage between the control gate electrode CG and the memory gate electrode MG201.

Further, the increase in thickness of the insulation film (herein, the insulation film MZ and the insulation film ZF201) interposed between the control gate electrode CG and the memory gate electrode MG201 leads to a decrease in electric field to be applied to the insulation film interposed between the control gate electrode CG and the memory gate electrode MG201 during the erase operation of the FN method. This acts so as to suppress the phenomenon in which holes are implanted into the insulation film MZ (MZ2) interposed between the control gate electrode CG and the memory gate electrode MG201. For this reason, in the second study example of FIG. 27, provision of the insulation film ZF201 results in an increase in total thickness T202 of the insulation films MZ and ZF201 between the control gate electrode CG and the memory gate electrode MG201. This can suppress the occurrence of the phenomenon in which holes are implanted into the insulation film MZ (MZ2) interposed between the control gate electrode CG and the memory gate electrode MG201 during the erase operation of the FN method. As a result, when the FN method is used for the erase method, it is possible to obtain an effect of improving the retention characteristics.

However, a study by the present inventors indicated the following: in the semiconductor device of the second study example shown in FIG. 27, not only the insulation film MZ but also the insulation film ZF201 are interposed between the memory gate electrode MG201 and the control gate CLG. As a result, the following problem is caused.

Namely, the applied voltage of the control gate electrode CG controls the inversion layer in the channel region (the substrate region immediately under the control gate electrode CG) of the control transistor. The applied voltage of the memory gate electrode MG201 controls the inversion layer in the channel region (the substrate region immediately under the memory gate electrode MG201) of the memory transistor. However, the substrate region (corresponding to the substrate region RG201 shown in an enlarged view of FIG. 27) immediately under the region between the memory gate electrode MG201 and the control gate electrode CG is less likely to be applied with an electric field, so that the inversion layer is difficult to control. The dimension T203 in the gate length direction (channel length direction) of the substrate region RG201 in which the inversion layer is difficult to control is roughly equal to the total thickness T202 of the insulation film MZ and the insulation film ZF201 interposed between the control gate electrode CG and the memory gate electrode MG201 (T202=T203). On the other hand, in the case of the first study example of FIG. 26, the substrate region (corresponding to the substrate region RG101 shown in an enlarged view of FIG. 26) immediately under the region between the memory gate electrode MG101 and the control gate electrode CG is less likely to be applied with an electric field, and the inversion layer is difficult to control. The dimension T103 in the gate length direction (channel length direction) of the substrate region RG101 in which the inversion layer is difficult to control is roughly equal to the thickness T102 of the insulation film MZ interposed between the control gate electrode CG and the memory gate electrode MG101 (T102=T103).

For this reason, for the semiconductor device of the second study example shown in FIG. 27, the provision of the insulation film ZF201 results in an increase in the total thickness T202 of the insulation film MZ and the insulation film ZF201 interposed between the control gate electrode CG and the memory gate electrode MG201. This leads to a larger dimension T203 of the substrate region RG201. Namely, the dimension T203 (FIG. 27) of the substrate region RG201 in which the inversion layer is difficult to control in the case of the second study example is larger than the dimension T103 (FIG. 26) of the substrate region RG101 in which the inversion layer is difficult to control in the case of the first study example by the thickness of the insulation film ZF201.

The increase in dimension T203 of the substrate region RG201 leads to an increase in resistance between the source (MS) and the drain (MD) of the selection memory during the read operation. This results in a decrease in read current flowing through the selection memory cell (the current flowing between the semiconductor region MS and the semiconductor region MD). This may reduce the performances of the semiconductor device having a nonvolatile memory. For example, the reduction of the read current may reduce the read speed. Further, the reduction of the read current entails a necessity of increasing the amount of holes implanted for erase. This may reduce the erase speed. Alternatively, the voltage across the source (MS) and the drain (MD) for the read operation may possibly be increased to increase the rad current. This however results in an increase in power consumption for read.

<Regarding Main Features and Effects>

The semiconductor device of the present embodiment is a semiconductor device having a nonvolatile memory.

The semiconductor device of the present embodiment has a semiconductor substrate SB, a control gate electrode CG (first gate electrode) formed over the semiconductor substrate SB via an insulation film GF (first gate insulation film), and a memory gate electrode MG (second gate electrode) formed over the semiconductor substrate SB via an insulation film MZ (second gate insulation film) having a charge accumulation part. The insulation film MZ is formed across between the semiconductor substrate SB and the memory gate electrode MG, and between the control gate electrode CG and the memory gate electrode MG. The semiconductor device of the present embodiment further has an insulation film ZF formed between the control gate electrode CG and the memory gate electrode MG. The insulation film ZF is formed between the insulation film MZ and the memory gate electrode MG, in between the control gate electrode CG and the memory gate electrode MG. The control gate electrode CG and the memory gate electrode MG are adjacent to each other via the insulation film MZ and the insulation film ZF. The insulation film ZF is not formed under the memory gate electrode MG. The lower end face ZFa of the insulation film ZF is at a higher position than that of the lower surface of the memory gate electrode MG. A part of the memory gate electrode MG is present under the lower end face ZFa of the insulation film ZF.

As one of the main features of the present embodiment, the insulation film MZ and the insulation film ZF are interposed between the control gate electrode CG and the memory gate electrode MG. The insulation film MZ having a charge accumulation part is formed across between the semiconductor substrate SB and the memory gate electrode MG, and between the control gate electrode CG and the memory gate electrode MG. The insulation film ZF is formed between the control gate electrode CG and the memory gate electrode MG, but is not formed under the memory gate electrode MG.

In the present embodiment, by providing the insulation film ZF, it is possible to increase the total thickness T2 of the insulation film MZ and the insulation film ZF interposed between the control gate electrode CG and the memory gate electrode MG. This can improve the breakdown voltage between the control gate electrode CG and the memory gate electrode MG.

Namely, the insulation film ZF is interposed between the control gate electrode CG (CLG) and the memory gate electrode MG, but is not formed under the memory gate electrode MG. For this reason, even when the thickness of the insulation film ZF interposed between the control gate electrode CG (CLG) and the memory gate electrode MG is increased, the thickness of the insulation film (herein, the insulation film MZ) interposed between the memory gate electrode MG and the semiconductor substrate SB is not affected. Namely, the thickness of the insulation film ZF interposed between the control gate electrode CG (CLG) and the memory gate electrode MG can be controlled independent of the thickness of the insulation film MZ interposed between the memory gate electrode MG and the semiconductor substrate SB. Accordingly, in the present embodiment, the total thickness T2 of the insulation film MZ and the insulation film ZF interposed between the control gate electrode CG (CLG) and the memory gate electrode MG can be increased. Specifically, the total thickness T2 of the insulation film MZ and the insulation film ZF interposed between the control gate electrode CG (CLG) and the memory gate electrode MG can be set larger than the thickness T1 of the insulation film MZ interposed between the semiconductor substrate SB and the memory gate electrode MG (T2>T1). As a result, for the thickness T1 of the insulation film MZ interposed between the semiconductor substrate SB and the memory gate electrode MG, while ensuring the optimum thickness for the operation of the nonvolatile memory, the total thickness T2 of the insulation film MZ and the insulation film ZF interposed between the control gate electrode CG (CLG) and the memory gate electrode MG is increased. This can improve the breakdown voltage between the control gate electrode CG and the memory gate electrode MG. Therefore, it is possible to improve the reliability of the semiconductor device having a nonvolatile memory.

Further, the increase in thickness of the insulation film (herein, the insulation film MZ and the insulation film ZF) interposed between the control gate electrode CG (CLG) and the memory gate electrode MG leads to a decrease in electric field to be applied to the insulation film interposed between the control gate electrode CG and the memory gate electrode MG during the erase operation of the FN method. This acts so as to suppress the phenomenon in which holes are implanted into the insulation film MZ (MZ2) interposed between the control gate electrode CG and the memory gate electrode MG. Namely, this can suppress the phenomenon in which holes are implanted from the memory gate electrode MG into the insulation film MZ (MZ2) through the path of the arrow YG1 of FIG. 26. For this reason, in the present embodiment, provision of the insulation film ZF results in an increase in total thickness T2 of the insulation film MZ and the insulation film ZF interposed between the control gate electrode CG (CLG) and the memory gate electrode MG. This can suppress the occurrence of the phenomenon in which holes are implanted into the insulation film MZ (MZ2) interposed between the control gate electrode CG and the memory gate electrode MG during the erase operation of the FN method. As a result, when the FN method is used for the erase method, it is possible to obtain an effect of improving the retention characteristics. Therefore, it is possible to improve the reliability of the semiconductor device having a nonvolatile memory.

In other words, in the present embodiment, by providing the insulation film ZF, it is possible to improve the breakdown voltage between the control gate electrode CG and the memory gate electrode MG. This effect can be obtained not depending upon the erase method. Further, when the FN method is used for the erase method, provision of the insulation film ZF can also provide the effect of improving the retention characteristics.

As another of the main features of the present embodiment, the lower end face ZFa of the insulation film ZF is at a higher position than that of the lower surface MG1 of the memory gate electrode MG, and a part of the memory gate electrode MG is present under the lower end face ZFa of the insulation film ZF.

When the control gate electrode CG is applied with a voltage equal to or larger than the threshold voltage, an inversion layer is formed in the channel region of the control transistor (the substrate region immediately under the control gate electrode CG). When the memory gate electrode MG is applied with a voltage equal to or higher than the threshold voltage, an inversion layer is formed in the channel region of the memory transistor (the substrate region immediately under the memory gate electrode MG). When the control gate electrode CG is applied with a voltage lower than the threshold voltage, an inversion layer is not formed in the channel region of the control transistor (the substrate region immediately under the control gate electrode CG). When the memory gate electrode MG is applied with a voltage lower than the threshold voltage, an inversion layer is not formed in the channel region of the memory transistor (the substrate region immediately under the memory gate electrode MG). Namely, the applied voltage of the control gate electrode CG controls the inversion layer in the channel region of the control transistor (the substrate region immediately under the control gate electrode CG). The applied voltage of the memory gate electrode MG controls the inversion layer in the channel region of the memory transistor (the substrate region immediately under the memory gate electrode MG). However, the substrate region immediately under the region between the memory gate electrode MG and the control gate electrode CG (corresponding to the substrate region RG shown in enlarged view of FIG. 2) is less likely to be applied with the electric field by the memory gate electrode MG or the control gate electrode CG, so that the inversion layer therein is difficult to control. The dimension T3 in the gate length direction (channel length direction) of the substrate region RG in which the inversion layer is difficult to control is roughly equal to the thickness T4 of the insulation film MZ interposed between the control gate electrode CG and the memory gate electrode MG (T3=T4).

Namely, in the present embodiment, the memory gate electrode MG is also present under the lower end face ZFa of the insulation film ZF. Accordingly, the substrate region under the insulation film ZF can also be applied with the electric field by the memory gate electrode MG. In other words, the substrate region under the insulation film ZF is also the substrate region under the memory gate electrode MG. For this reason, the applied voltage of the memory gate electrode MG tends to control the inversion layer. For this reason, in the present embodiment, provision of the insulation film ZF results in an increase in total thickness T2 of the insulation film MZ and the insulation film ZF interposed between the control gate electrode CG and the memory gate electrode MG. However, the memory gate electrode MG is also present under the lower end face ZFa of the insulation film ZF. For this reason, it is possible to reduce the dimension T3 of the substrate region RG in which the inversion layer is difficult to control. Namely, for the respective dimensions T3, T103, and T203 of the substrate regions RG, RG101, and RG201 in each of which the inversion layer is difficult to control, the dimension T3 of the substrate region RG in the case of the present embodiment (FIG. 2) is smaller than the dimension T203 of the substrate region RG201 in the case of the second study example (FIG. 27) by the thickness of the insulation film ZF201, and is roughly equal to the dimension T103 of the substrate region RG101 in the case of the first study example (FIG. 26).

In the present embodiment, the dimension T3 of the substrate region RG in which the inversion layer is difficult to control (FIG. 2) can be reduced. For this reason, the resistance between the source (MS) and the drain (MD) of the selection memory cell can be suppressed at the time of the read operation. Accordingly, the current flowing through the selection memory cell (the current flowing between the semiconductor region MS and the semiconductor region MD) can be increased. This can improve the performances of the semiconductor device having a nonvolatile memory. For example, the increase in read current can improve the read speed. Further, with an increase in read current, the amount of holes implanted during erase can be reduced. This can improve the erase speed. Further, even when the voltage between the source (MS) and the drain (MD) at the time of the read operation is not increased, the read current can be ensured. For this reason, the power consumption at the time of read can be suppressed.

Thus, in the present embodiment, not only the insulation film MZ but also the insulation film ZF are interposed between the control gate electrode CG and the memory gate electrode MG. As a result, the breakdown voltage between the control gate electrode CG and the memory gate electrode MG can be improved as compared with the first study example of FIG. 26. Further, when the FN method is used for the erase method, the effect of improving the retention characteristics can also be obtained. Then, in the present embodiment, the lower end face ZFa of the insulation film ZF is set higher than the lower surface MG1 of the memory gate electrode MG, so that the memory gate electrode MG is also present under the lower end face ZFa of the insulation film ZF. As a result, the resistance between the source (MS) and the drain (MD) of the selection memory cell can be set lower as compared with the second study example of FIG. 27 at the time of the read operation, and can be suppressed roughly equally with the first study example of FIG. 26. For this reason, the performances of the semiconductor device having a nonvolatile memory can be improved.

In other words, in the present embodiment, it is possible to solve the problem encountered in the case of the first study example of FIG. 26, namely, the problem of the breakdown voltage between the control gate electrode CG and the memory gate electrode MG, and the problem of the retention characteristics when the FN erase method is used. In addition, it is possible to solve the problem encountered in the case of the second study example of FIG. 27, namely, the problem of the resistance between the source (MS) and the drain (MD) of the selection memory cell at the time of the read operation. Therefore, in the present embodiment, it is possible to improve the comprehensive reliability and performances of the semiconductor device having a nonvolatile memory.

Further, for manufacturing such a semiconductor device of the present embodiment, the following method can be used.

Namely, as in FIG. 12, the control gate electrode CG (CLG) is formed over the semiconductor substrate SB via the insulation film GF (first gate insulation film). Then, as in FIG. 13, the insulation film MZ is formed over the semiconductor substrate SB in such a manner as to cover the control gate electrode CG (CLG). Over the insulation film MZ, the insulation film ZF1 is formed. Over the insulation film ZF1, the insulation film ZF2 is formed. Incidentally, the insulation film MZ is an insulation film having a charge accumulation part. Further, the insulation film ZF1 and the insulation film ZF2 are formed of mutually different materials. Then, in the etching step of FIG. 14, the insulation film ZF2 is anisotropically etched. As a result, the insulation film ZF1 is exposed, and the insulation film ZF2 is left over the side surface of the control gate electrode CG (CLG) via the insulation film MZ and the insulation film ZF1. Then, in the etching step of FIG. 15, the insulation film ZF1 is isotropically etched. As a result, the insulation film MZ is exposed, and the insulation film ZF1 and the insulation film ZF2 are left over the side surface of the control gate electrode CG (CLG) via the insulation film MZ. Then, as in FIG. 16, a film for forming the memory gate electrode MG (herein, the silicon film PS2) is formed over the insulation film MZ. Then, the film (silicon film PS2) is etched back. As a result, the memory gate electrode MG is formed as in FIG. 17. The memory gate electrode MG is formed over the semiconductor substrate SB via the insulation film MZ. The memory gate electrode MG and the control gate electrode CG (CLG) are adjacent to each other via the insulation film MZ, the insulation film ZF1, and the insulation film ZF2. Under the memory gate electrode MG, the insulation film ZF1 and the insulation film ZF2 are not arranged. Such steps can provide a structure in which the lower end faces ZF1a and ZF2a of the insulation films ZF1 and ZF2 present between the control gate electrode CG (CLG) and the memory gate electrode MG are at a higher position than that of the lower surface MG1 of the memory gate electrode MG, and a part of the memory gate electrode MG is present under the lower end faces ZF1a and ZF2a.

Other features and effects of the present embodiment will be further described.

The insulation film ZF is formed of a lamination film of the insulation film ZF1 and the insulation film ZF2 formed of mutually different materials. Between the control gate electrode CG (CLG) and the memory gate electrode MG, of the insulation films ZF1 and ZF2, the insulation film ZF1 is situated on the control gate electrode CG (CLG) side, and the insulation film ZF2 is situated on the memory gate electrode MG side. The insulation film ZF is formed of a lamination film of the insulation film ZF1 and the insulation film ZF2 formed of mutually different materials. As a result, it becomes possible to readily and precisely implement a structure in which the lower end face ZFa of the insulation film ZF is set higher than the lower surface MG1 of the memory gate electrode MG, so that the memory gate electrode MG is also present under the lower end face ZFa of the insulation film ZF.

Further, in the etching step of FIG. 14, the insulation film ZF2 is anisotropically etched. At that step, etching of the insulation film ZF1 is suppressed. Whereas, in the etching step of FIG. 15, the insulation film ZF1 is isotropically etched. At that step, etching of the insulation film ZF2 is required to be suppressed. For this reason, the insulation film ZF1 and the insulation film ZF2 are formed of mutually different materials so as to ensure the etching selectivity between the insulation film ZF1 and the insulation film ZF2.

Further, in the etching step of FIG. 15, the insulation film ZF1 is isotropically etched. At that step, etching of the insulation film MZ3 is also required to be suppressed. For this reason, the insulation film ZF1 and the insulation film MZ3 are formed of mutually different materials so as to ensure the etching selectivity between the insulation film ZF1 and the insulation film MZ3.

The insulation film ZF2 and the insulation film MZ3 are more preferably formed of the mutually same material. As a result, it becomes possible to selectively isotropically etch the insulation film ZF1 while precisely suppressing etching of the insulation films ZF2 and MZ3 in the etching step of FIG. 15.

As a preferable combination of respective materials for the insulation films MZ1, MZ2, MZ3, ZF1, and ZF2, the case can be exemplified where the insulation films MZ1, MZ3, and ZF2 are each formed of a silicon oxide (silicon oxide film), and the insulation films MZ2 and ZF1 are each formed of a silicon nitride (silicon nitride film). In this case, it is possible to readily and precisely form the insulation film MZ suitable for the gate insulation film of the memory transistor, and it is possible to readily and precisely implement a structure in which the lower end face ZFa of the insulation film ZF formed of a lamination film of the insulation film ZF1 and the insulation film ZF2 is set higher than the lower surface MG1 of the memory gate electrode MG, so that the memory gate electrode MG is also present under the lower end face ZFa of the insulation film ZF.

Further, when the thickness T5 of the insulation film ZF is too small, the effects resulting from the provision of the insulation film ZF is reduced. Whereas, when the thickness T5 of the insulation film ZF is set too large, the dimension L1 of the memory gate electrode MG is reduced, resulting in an increase in resistance of the memory gate electrode MG, or an increase in dimension of the memory cell. From this viewpoint, the thickness T5 of the insulation film ZF is preferably 6 to 20 nm. In this case, the thickness of the insulation film ZF1 can be preferably set at about 3 to 10 nm. The thickness of the insulation film ZF2 can be preferably set at about 3 to 10 nm. Incidentally, the dimension L1 of the memory gate electrode MG is the dimension of the memory gate electrode MG at a higher position than that of the lower end face ZFa of the insulation film ZF, and is shown in FIG. 2. Further, the dimension L1 corresponds to the dimension measured in a direction along the gate length direction (the gate length direction of the memory gate electrode MG).

Whereas, the thickness T5 of the insulation film ZF is preferably smaller than the dimension L1 of the memory gate electrode MG (i.e., T5<L1). In other words, the dimension L1 of the memory gate electrode MG is preferably larger than the thickness T5 of the insulation film ZF. In other words, more than half of the gate length of the memory gate electrode MG is preferably assigned to the dimension L1 of the memory gate electrode MG. This can suppress the resistance of the memory gate electrode MG. Incidentally, the sum of the dimension L1 of the memory gate electrode MG and the thickness T5 of the insulation film ZF is roughly equal to the gate length of the memory gate electrode MG.

Further, the insulation film ZF has a lamination structure of the insulation film ZF1 and the insulation film ZF2. Accordingly, the lower end face ZFa of the insulation film ZF includes the lower end face ZF1a of the insulation film ZF1 and the lower end face ZF2a of the insulation film ZF2. A part of the memory gate electrode MG is present under the lower end faces ZF1a and ZF2a. Herein, the height position of the lower end faces ZF1a and ZF2a will be described.

In the height direction, the distance (interval) L2 between the lower end face ZF2a of the insulation film ZF2 and the top surface of the insulation film MZ (a portion of the insulation film MZ extending along the main surface of the semiconductor substrate SB) is substantially equal to the thickness T6 of the insulation film ZF1 (L2=T6). The distance L2 is equal to the thickness of the insulation film ZF1 removed in the etching step of FIG. 15. For this reason, in the manufactured semiconductor device, the distance L2 is substantially equal to the thickness T6 of the insulation film ZF1 present between the control gate CLG and the memory gate electrode MG. When the distance L2 between the lower end face ZF2a of the insulation film ZF2 and the top surface of the insulation film MZ is too small, the memory gate electrode MG becomes less likely to be formed under the lower end face ZFa of the insulation film ZF. A too large distance L2 results in reduction of the effect of suppressing the occurrence of the phenomenon in which holes are implanted into the insulation film MZ (MZ2) interposed between the control gate electrode CG and the memory gate electrode MG during the erase operation of the FN method. From this viewpoint, in the height direction, the distance L2 between the lower end face ZF2a of the insulation film ZF2 and the top surface of the insulation film MZ is preferably about 3 to 10 nm. Therefore, the thickness T6 of the insulation film ZF1 is preferably about 3 to 10 nm.

Further, the height position of the end ZF1a1 on the insulation film MZ side of the lower end face ZF1a of the insulation film ZF1 (see the enlarged view on the lower side of FIG. 2) is preferably higher than that of the lower surface MG1 of the memory gate electrode MG. As a result, the memory gate electrode MG is also present immediately under the end ZF1a1 on the insulation film MZ side of the lower end face ZF1a of the insulation film ZF1. This can precisely reduce the dimension T3 (FIG. 2) of the substrate region RG in which the inversion layer is difficult to control. For this reason, it is possible to more precisely suppress the resistance between the source (MS) and the drain (MD) of the selection memory cell at the time of the read operation.

Incidentally, the end ZF1a1 is the end ZF1a1 on the insulation film MZ side in the lower end face ZF1a of the insulation film ZF1, and also corresponds to the corner part formed of the lower end face ZF1a of the insulation film ZF1 and the surface of the insulation film ZF1 on the side thereof in contact with the insulation film MZ. Further, the end ZF1a1 is also the site of the lower end face ZF1a of the insulation film ZF1 adjacent to the insulation film MZ.

Figure 28:
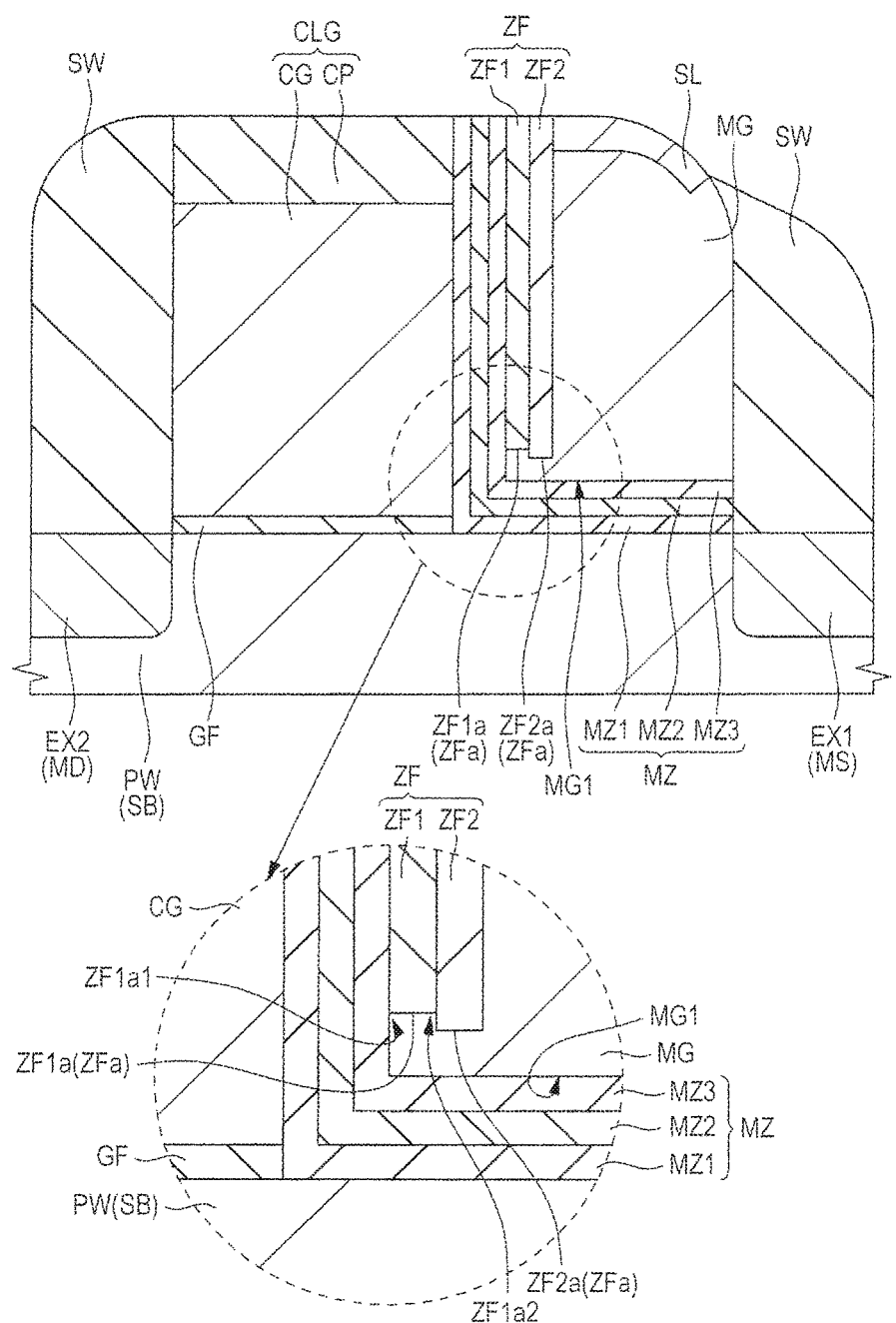
FIG. 28 is an essential part cross sectional view of a semiconductor device of a first modified example.
Figure 29:
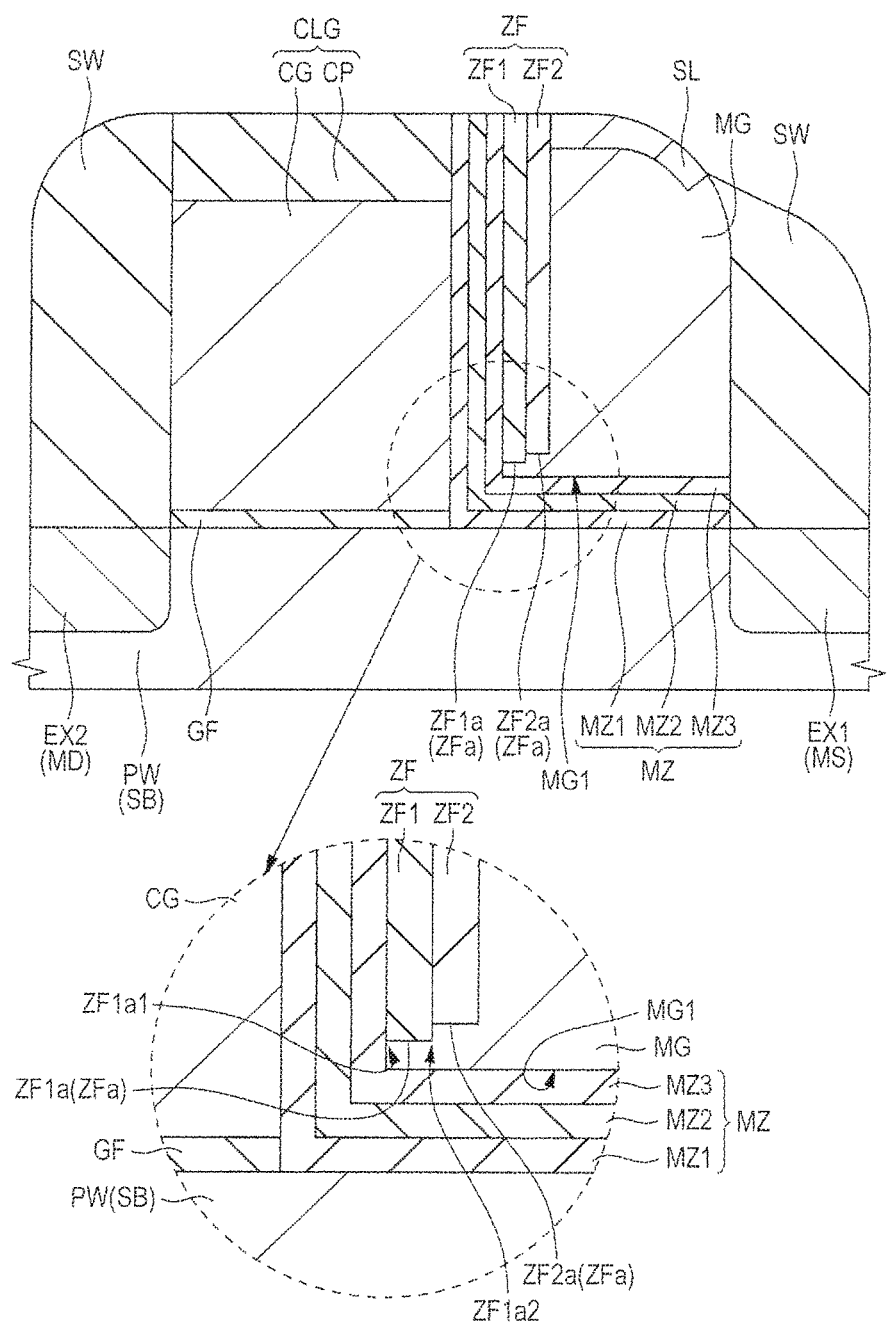
FIG. 29 is an essential part cross sectional view of a semiconductor device of a second modified example.
Figure 30:
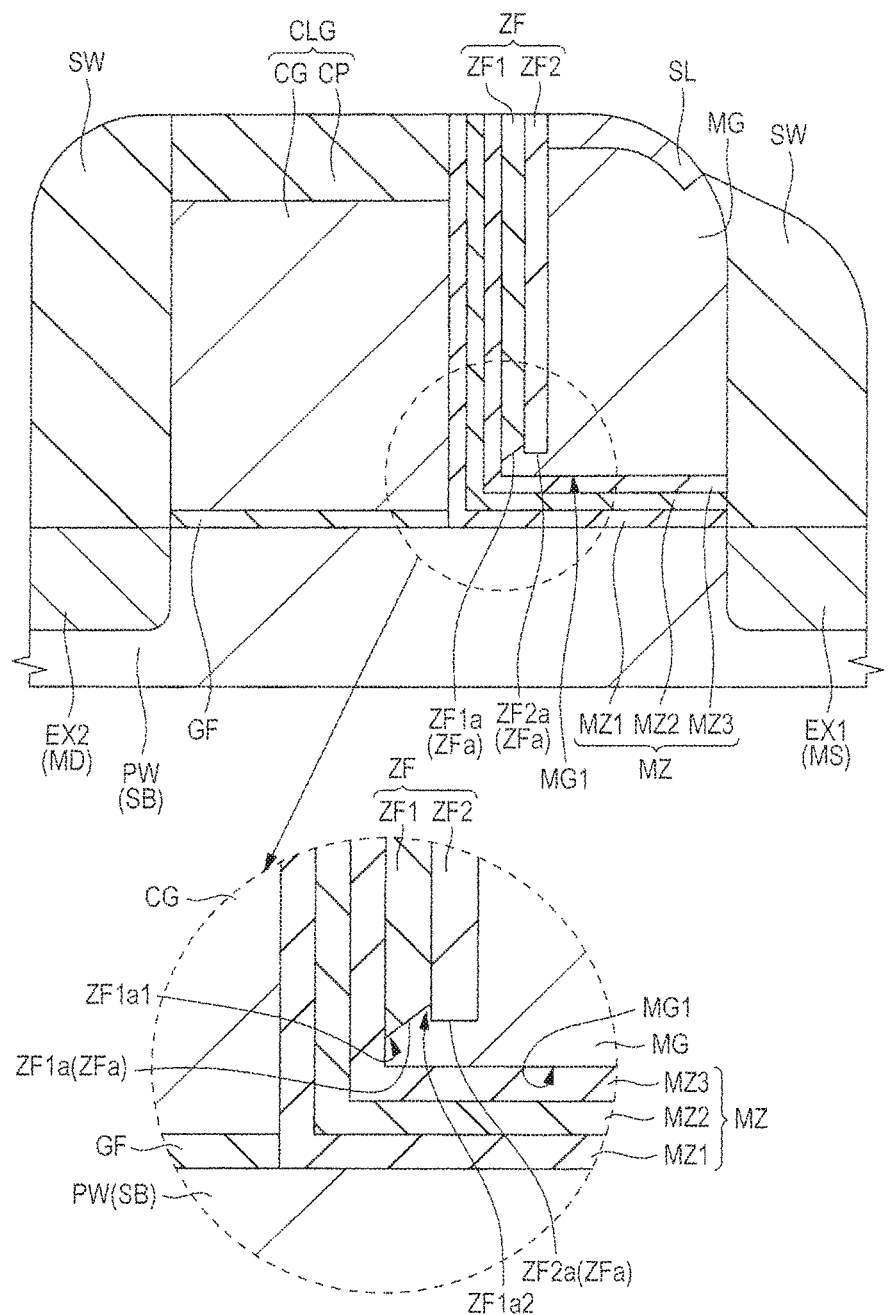
FIG. 30 is an essential part cross sectional view of a semiconductor device of a third modified example.

FIG. 28 is an essential part cross sectional view showing a first modified example of the semiconductor device of the present embodiment. FIG. 29 is an essential part cross sectional view showing a second modified example of the semiconductor device of the present embodiment. FIG. 30 is an essential part cross sectional view showing a third modified example of the semiconductor device of the present embodiment. The figures respectively correspond to FIG. 2. The case of FIG. 2, the case of FIG. 28 (first modified example), the case of FIG. 29 (second modified example), and the case of FIG. 30 (third modified example) are mutually equal to one another in height position of the lower end face ZF2a of the insulation film ZF2, but are different from one another in height position of the lower end face ZF1a of the insulation film ZF1.

In the case of FIG. 2, the height position of the lower end face ZF1a of the insulation film ZF1 was roughly equal to the height position of the lower end face ZF2a of the insulation film ZF2. For this reason, the height position of the end ZF1a2 on the insulation film ZF2 side of the lower end face ZF1a of the insulation film ZF1 was roughly equal to the height position of the lower end face ZF2a of the insulation film ZF2.

On the other hand, in the case of FIG. 28 (first modified example), the height position of the lower end face ZF1a of the insulation film ZF1 is higher than the height position of the lower end face ZF2a of the insulation film ZF2. Whereas, in the case of FIG. 29 (second modified example), the height position of the lower end face ZF1a of the insulation film ZF1 is lower than the height position of the lower end face ZF2a of the insulation film ZF2. For this reason, in the case of FIG. 28 (first modified example), the height position of the end ZF1a2 on the insulation film ZF2 side of the lower end face ZF1a of the insulation film ZF1 is higher than the height position of the lower end face ZF2a of the insulation film ZF2. Whereas, in the case of FIG. 29 (second modified example), the height position of the end ZF1a2 on the insulation film ZF2 side of the lower end face ZF1a of the insulation film ZF1 is lower than the height position of the lower end face ZF2a of the insulation film ZF2.

Incidentally, the end ZF1a2 is the end ZF1a2 on the insulation film ZF2 side in the lower end face ZF1a of the insulation film ZF1, and also corresponds to the corner part formed of the lower end face ZF1a of the insulation film ZF1, and the surface of the insulation film ZF1 on the side thereof in contact with the insulation film ZF2. Further, the end ZF1a2 is also the site of the lower end face ZF1a of the insulation film ZF1 adjacent to the insulation film ZF2.

Further, in the lower end face ZF1a of the insulation film ZF1, the end ZF1a1 and the end ZF1a2 are the ends opposite to each other (opposite in the gate length direction of the control gate electrode CG or the memory gate electrode MG).

In order to reduce the dimension T3 of the substrate region RG in which the inversion layer is difficult to control (FIG. 2), and to suppress the resistance between the source (MS) and the drain (MD) of the selection memory cell at the time of the read operation, it is effective that the memory gate electrode MG is present not only under the lower end face ZF2a of the insulation film ZF2, but also under the lower end face ZF1a of the insulation film ZF1. For this reason, the height position of the end ZF1a2 on the insulation film ZF2 side of the lower end face ZF1a of the insulation film ZF1 is preferably set equal to, or higher than that of the lower end face ZF2a of the insulation film ZF2. The reason for this will be described below.

Namely, in the case where, as in FIG. 29 (second modified example), the height position of the end ZF1a2 on the insulation film ZF2 side of the lower end face ZF1a of the insulation film ZF1 is lower than the lower end face ZF2a of the insulation film ZF2, when the silicon film PS2 is formed in the step of FIG. 16, a depositing gas becomes less likely to be supplied immediately under the lower end face ZF1a of the insulation film ZF1. Accordingly, the silicon film PS2 becomes less likely to be formed immediately under the lower end face ZF1a of the insulation film ZF1. This results in that the memory gate electrode MG becomes less likely to be formed immediately under the lower end face ZF1a of the insulation film ZF1. For this reason, it becomes difficult to control the manufacturing steps of the semiconductor device.

In contrast, in the case where, as in FIGS. 2 and 28 (first modified example) and FIG. 30 (third modified example), the height position of the end ZF1a2 on the insulation film ZF2 side of the lower end face ZF1a of the insulation film ZF1 is equal to, or higher than that of the lower end face ZF2a of the insulation film ZF2, when the silicon film PS2 is formed in the step of FIG. 16, the silicon film PS2 becomes more likely to be also formed immediately under the lower end face ZF1a of the insulation film ZF1. As a result, it becomes easy to control the manufacturing steps of the semiconductor device, and it becomes possible to more precisely form the memory gate electrode MG immediately under the lower end face ZF1a of the insulation film ZF1. For this reason, the height position of the end ZF1a2 on the insulation film ZF2 side of the lower end face ZF1a of the insulation film ZF1 is preferably set equal to, or higher than that of the lower end face ZF2a of the insulation film ZF2.

Further, when the height position of the end ZF1a2 on the insulation film ZF2 side of the lower end face ZF1a of the insulation film ZF1 is too high, the height of the upper end face ZF1b of the insulation film ZF1 at the stage upon completion of the etching step of FIG. 15 is reduced by that much. At the stage upon completion of the etching step of FIG. 17, the silicon film PS becomes more likely to be left over the upper end face ZF2b of the insulation film ZF2. As described above, it is desirable to prevent the etching residue of the silicon film PS from being left over the upper end face ZF2b of the insulation film ZF2. For this reason, the height position of the end ZF1a2 on the insulation film ZF2 side of the lower end face ZF1a of the insulation film ZF1 is preferably lower than the position higher than the lower end face ZF2a of the insulation film ZF2 by 10 nm, more preferably lower than the position higher than the lower end face ZF2a of the insulation film ZF2 by 5 nm, and most preferably equal to that of the lower end face ZF2a of the insulation film ZF2. Namely, the height position of the end ZF1a2 of the lower end face ZF1a of the insulation film ZF1 is set equal to, or higher than that of the lower end face ZF2a of the insulation film ZF2. However, the difference in height between the end ZF1a2 and the lower end face ZF2a of the insulation film ZF2 is preferably less than 10 nm, and more preferably less than 5 nm. Most preferably, the end ZF1a2 is at the same height position as that of the lower end face ZF2a of the insulation film ZF2. As a result, it is possible to precisely form the memory gate electrode MG immediately under the lower end face ZF1a of the insulation film ZF1. In addition, it becomes easier to prevent the etching residue of the silicon film PS from being left over the upper end face ZF2b of the insulation film ZF2.

Whereas, in the case of FIG. 30 (third modified example), the height position of the end ZF1a2 on the insulation film ZF2 side of the lower end face ZF1a of the insulation film ZF1 is set equal to, or higher than that of the lower end face ZF2a of the insulation film ZF2. However, the height position of the end ZF1a1 on the insulation film MZ side of the lower end face ZF1a of the insulation film ZF1 is set higher than that of the lower surface MG1 of the memory gate electrode MG, and lower than the lower end face ZF2a of the insulation film ZF2. Namely, the case of FIG. 30 (third modified example) is set equal in height position of the end ZF1a2 on the insulation film ZF2 side of the lower end face ZF1a of the insulation film ZF1 to the case of FIG. 2 or the case of FIG. 28 (first modified example), and is set equal in height position of the end ZF1a1 on the insulation film MZ side of the lower end face ZF1a of the insulation film ZF1 to the case of FIG. 29 (second modified example). In other words, in the case of 30 (third modified example), the height position of the end ZF1a1 is lower than the height position of the end ZF1a2. For this reason, the lower end face ZF1a of the insulation film ZF1 may be inclined with respect to the surface in parallel with the main surface of the semiconductor substrate SB, or may be a curved surface, or may be in other forms. In contrast, the lower end face ZF2a of the insulation film ZF2 is nearly a surface generally in parallel with the main surface of the semiconductor substrate SB. In such a case of FIG. 30 (third modified example), the following advantages can be provided.

Namely, in order to allow more precise formation of the memory gate electrode MG immediately under the lower end face ZF1a of the insulation film ZF1, it is effective that the height position of the end ZF1a2 on the insulation film ZF2 side of the lower end face ZF1a of the insulation film ZF1 is set equal to, or higher than that of the lower end face ZF2a of the insulation film ZF2. For this reason, from the viewpoint of allowing the more precise formation of the memory gate electrode MG immediately under the lower end face ZF1a of the insulation film ZF1, the case of FIG. 2, the case of FIG. 28 (first modified example), and the case of FIG. 30 (third modified example) are more advantageous than the case of FIG. 29 (second modified example).

On the other hand, from the viewpoint of suppressing the occurrence of the phenomenon in which holes are implanted into the insulation film MZ (MZ2) interposed between the control gate electrode CG and the memory gate electrode MG at the time of the erase operation of the FN method, and to improve the retention characteristics, it is more advantageous to set lower the height position of the end ZF1a1 on the insulation film MZ side of the lower end face ZF1a of the insulation film ZF1. Namely, it is more advantageous to set lower the height of the portion of the memory gate electrode MG situated under the end ZF1a1 of the lower end face ZF1a of the insulation film ZF1. For this reason, from this viewpoint, the case of FIG. 29 (second modified example) and the case of FIG. 30 (third modified example) are more advantageous than the case of FIG. 2 and the case of FIG. 28 (first modified example).

Therefore, in the case of FIG. 30 (third modified example), the height position of the end ZF1a2 on the insulation film ZF2 side of the lower end face ZF1a of the insulation film ZF1 is set equal to, or higher than that of the lower end face ZF2a of the insulation film ZF2. This can provide an advantage in which the memory gate electrode MG can be formed immediately under the lower end face ZF1a of the insulation film ZF1 more precisely. Further, in the case of FIG. 30 (third modified example), the height position of the end ZF1a1 on the insulation film MZ side of the lower end face ZF1a of the insulation film ZF1 is set lower (lower than the lower end face ZF2a of the insulation film ZF2). This also provides an advantage of allowing a more improvement of the retention characteristics. In terms of the fact that both the advantages can be obtained, the case of FIG. 30 (third modified example) is more advantageous than the case of FIG. 2, the case of FIG. 28 (first modified example), and the case of FIG. 29 (second modified example).

Up to this point, the invention completed by the present inventors was described specifically bay way of the embodiments. However, it is naturally understood that the present invention is not limited to the embodiments, and may be variously changed within the scope not departing from the gist thereof.

What is claimed is:
1. A semiconductor device, comprising:
a semiconductor substrate;
a first gate electrode for a memory cell of a nonvolatile memory formed over the semiconductor substrate via a first gate insulation film;
a second gate electrode for the memory cell of the nonvolatile memory formed over the semiconductor substrate via a second gate insulation film having a charge accumulation part; and
a first insulation film formed between the first gate electrode and the second gate electrode,
wherein the second gate insulation film is formed across between the semiconductor substrate and the second gate electrode, and between the first gate electrode and the second gate electrode,
wherein the first insulation film is formed between the second gate insulation film and the second gate electrode, in between the first gate electrode and the second gate electrode, and is in contact with the second gate electrode,
wherein the first gate electrode and the second gate electrode are adjacent to each other via the second gate insulation film and the first insulation film,
wherein the first insulation film is not formed under the second gate electrode,
wherein the lower end face of the first insulation film is at a higher position than that of the lower surface of the second gate electrode, and
wherein a part of the second gate electrode is directly under the lower end face of the first insulation film.
2. The semiconductor device according to claim 1,
wherein the second gate insulation film comprises a lamination film having a second insulation film, a third insulation film over the second insulation film, and a fourth insulation film over the third insulation film, wherein the third insulation film functions as the charge accumulation part, and wherein respective bandgaps of the second insulation film and the fourth insulation film are larger than the bandgap of the third insulation film.

3. The semiconductor device according to claim 2, wherein the first insulation film comprises a lamination film of a fifth insulation film and a sixth insulation film, wherein between the first gate electrode and the second gate electrode, of the fifth and sixth insulation films, the fifth insulation film is situated on the first gate electrode side, and the sixth insulation film is situated on the second gate electrode side, and wherein the fifth insulation film and the sixth insulation film comprise mutually different materials.

4. The semiconductor device according to claim 3, wherein the fourth insulation film and the fifth insulation film comprise mutually different materials.

5. The semiconductor device according to claim 3, wherein the second insulation film, the fourth insulation film, and the sixth insulation film each comprise silicon oxide, and wherein the third insulation film and the fifth insulation film each comprise silicon nitride.

6. The semiconductor device according to claim 3, wherein the lower end face of the first insulation film includes a first lower end face of the fifth insulation film, and a second lower end face of the sixth insulation film, and wherein a part of the second gate electrode is present under the first lower end face and the second lower end face.

7. The semiconductor device according to claim 6, wherein the height position of a first end of the first lower end face on the second gate insulation film side is higher than that of the lower surface of the second gate electrode.

8. The semiconductor device according to claim 6, wherein the height position of a second end of the first lower end face on the sixth insulation film side is equal to, or higher than that of the second lower end face.

9. The semiconductor device according to claim 8, wherein the height position of a first end of the first lower end face on the second gate insulation film side is higher than that of the lower surface of the second gate electrode, and lower than the second lower end face.

10. The semiconductor device according to claim 1, wherein a second thickness of the total thickness of the second gate insulation film and the first insulation film interposed between the first gate electrode and the second gate electrode is larger than a first thickness of the second gate insulation film interposed between the semiconductor substrate and the second gate electrode.

11. The semiconductor device according to claim 1, further comprising a first semiconductor region and a second semiconductor region of a first conductivity type formed in the semiconductor substrate, wherein the first gate electrode and the second gate electrode are formed over the semiconductor substrate between the first semiconductor region and the second semiconductor region.

12. A method for manufacturing a semiconductor device having a memory cell of a nonvolatile memory, the method comprising the steps of:

(a) providing a semiconductor substrate;

(b) forming a first gate electrode for the memory cell over the semiconductor substrate via a first gate insulation film;

(c) forming a second gate insulation film having a charge accumulation part over the semiconductor substrate in such a manner as to cover the first gate electrode;

(d) forming a first insulation film over the second gate insulation film;

(e) forming a second insulation film formed of a different material from that for the first insulation film over the first insulation film;

(f) anisotropically etching the second insulation film, thereby to expose the first insulation film, and to leave the second insulation film over a side surface of the first gate electrode via the second gate insulation film and the first insulation film;

(g) after the step (f), isotropically etching the first insulation film, thereby to expose the second gate insulation film, and to leave the first insulation film and the second insulation film over a side surface of the first gate electrode via the second gate insulation film;

(h) after the step (f), forming a first film for forming a second gate electrode for the memory cell over the second gate insulation film; and (i) etching back the first film, thereby to form the second gate electrode, wherein the second gate electrode is formed over the semiconductor substrate via the second gate insulation film, wherein the first gate electrode and the second gate electrode are adjacent to each other via the second gate insulation film, the first insulation film, and the second insulation film, wherein the first insulation film and the second insulation film are not formed under the second gate electrode, wherein a first lower end face of the first insulation film, and a second lower end face of the second insulation film present between the first gate electrode and the second gate electrode are at a higher position than that of the lower surface of the second gate electrode, and wherein a part of the second gate electrode is present under the first lower end face of the first insulation film, and the second lower end face of the second insulation film present between the first gate electrode and the second gate electrode.

13. The method for manufacturing a semiconductor device according to claim 12, wherein the second gate insulation film comprises a lamination film having a third insulation film, a fourth insulation film over the third insulation film, and a fifth insulation film over the fourth insulation film, wherein the fourth insulation film functions as the charge accumulation part, and wherein respective bandgaps of the third insulation film and the fifth insulation film are larger than the bandgap of the fourth insulation film.

14. The method for manufacturing a semiconductor device according to claim 13, wherein the first insulation film and the fifth insulation film comprise mutually different materials.

15. The method for manufacturing a semiconductor device according to claim 13, wherein the second insulation film, the third insulation film, and the fifth insulation film each comprise silicon oxide, and wherein the first insulation film and the fourth insulation film each comprise silicon nitride.

16. The method for manufacturing a semiconductor device according to claim 13,
wherein in the step (f), the second insulation film is anisotropically etched under the conditions in which the first insulation film is less likely to be etched than the second insulation film, and
wherein in the step (g), the first insulation film is isotropically etched under the conditions in which the second insulation film is less likely to be etched than the first insulation film.

17. The method for manufacturing a semiconductor device according to claim 12,
wherein in the step (g), a portion of the first insulation film extending in such a manner as to be along the main surface of the semiconductor substrate is removed by isotropic etching.

18. The method for manufacturing a semiconductor device according to claim 12,
wherein the height position of a first end of the first lower end face on the second gate insulation film side is higher than that of the lower surface of the second gate electrode.

19. The method for manufacturing a semiconductor device according to claim 12,
wherein the height position of a second end of the first lower end face on the second insulation film side is equal to, or higher than that of the second lower end face.

20. The method for manufacturing a semiconductor device according to claim 19,
wherein the height position of a first end of the first lower end face on the second gate insulation film side is higher than that of the lower surface of the second gate electrode, and lower than that of the second lower end face.

* * * * *